United States Patent
Arisumi et al.

(10) Patent No.: US 10,411,028 B2
(45) Date of Patent: Sep. 10, 2019

(54) SEMICONDUCTOR DEVICE AND METHOD FOR MANUFACTURING SAME

(71) Applicant: Toshiba Memory Corporation, Minato-ku (JP)

(72) Inventors: Osamu Arisumi, Kuwana (JP); Yusuke Kawano, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/915,601

(22) Filed: Mar. 8, 2018

(65) Prior Publication Data
US 2019/0067312 A1 Feb. 28, 2019

(30) Foreign Application Priority Data
Aug. 31, 2017 (JP) .................. 2017-167063

(51) Int. Cl.
*H01L 27/115* (2017.01)
*H01L 27/11568* (2017.01)
*H01L 27/11556* (2017.01)
*H01L 27/11582* (2017.01)
*H01L 27/11521* (2017.01)
*H01L 29/423* (2006.01)
(Continued)

(52) U.S. Cl.
CPC .. *H01L 27/11568* (2013.01); *H01L 27/11521* (2013.01); *H01L 27/11556* (2013.01); *H01L 27/11582* (2013.01); *H01L 27/11565* (2013.01); *H01L 29/41741* (2013.01); *H01L 29/4234* (2013.01)

(58) Field of Classification Search
CPC ......... H01L 27/11582; H01L 27/11565; H01L 29/41741; H01L 29/4234
See application file for complete search history.

(56) References Cited

U.S. PATENT DOCUMENTS 8,344,385 B2    1/2013  Kim et al.
8,673,721 B2 *  3/2014  Toshiro ............. H01L 27/11551
                                              438/287
(Continued)

FOREIGN PATENT DOCUMENTS

JP    2014-57067    3/2014
JP    2015-56444    3/2015
(Continued)

*Primary Examiner* — Nicholas J Tobergte
(74) *Attorney, Agent, or Firm* — Oblon, McClelland, Maier & Neustadt, L.L.P.

(57) ABSTRACT

According to one embodiment, the source layer includes a semiconductor layer including a dopant. The columnar portions are disposed in an area between the separation portions. The columnar portions extend in the stacking direction through the stacked body and through the semiconductor layer. The columnar portions include a plurality of semiconductor bodies including sidewall portions contacting the semiconductor layer. The dopant diffusion prevention film is provided inside the semiconductor layer and separated from the columnar portions in an area between the columnar portions. The dopant diffusion prevention film is not provided inside the semiconductor layer in an area between the separation portion and the columnar portions.

13 Claims, 36 Drawing Sheets

(51) Int. Cl.
    *H01L 27/11565*    (2017.01)
    *H01L 29/417*      (2006.01)

(56) References Cited

U.S. PATENT DOCUMENTS

| | | | | |
|---|---|---|---|---|
| 8,872,256 | B2* | 10/2014 | Lee | ............ H01L 27/1052 |
| | | | | 257/326 |
| 9,076,820 | B2* | 7/2015 | Kitazaki | ............ H01L 29/66666 |
| 9,076,879 | B2 | 7/2015 | Yoo et al. | |
| 9,431,419 | B2 | 8/2016 | Fukuzumi et al. | |
| 9,583,504 | B2 | 2/2017 | Higuchi et al. | |
| 9,653,475 | B1 | 5/2017 | Yoshimizu et al. | |
| 9,893,080 | B2* | 2/2018 | Tsuda | ............ H01L 27/11582 |
| 9,911,749 | B2* | 3/2018 | Sakamoto | ............ H01L 27/11582 |
| 9,997,533 | B2* | 6/2018 | Yoshimizu | ............ H01L 27/11582 |
| 2015/0179662 | A1* | 6/2015 | Makala | ............ H01L 27/11578 |
| | | | | 257/314 |
| 2015/0206897 | A1 | 7/2015 | Kuniya | |
| 2017/0077114 | A1 | 3/2017 | Yoshimori et al. | |
| 2017/0263621 | A1* | 9/2017 | Wakatsuki | ............ H01L 27/11582 |
| 2018/0040742 | A1* | 2/2018 | Matsuo | ............ H01L 27/11565 |
| 2018/0053781 | A1* | 2/2018 | Yoshimizu | ............ H01L 27/11582 |
| 2018/0108674 | A1* | 4/2018 | Lee | ............ H01L 21/76816 |
| 2018/0323210 | A1* | 11/2018 | Kamigaichi | ............ H01L 27/11582 |
| 2019/0115363 | A1* | 4/2019 | Choi | ............ H01L 27/11582 |

FOREIGN PATENT DOCUMENTS

| | | | |
|---|---|---|---|
| JP | 2015-138834 | | 7/2015 |
| JP | 2017-54974 | | 3/2017 |
| JP | 2017-103328 | | 6/2017 |
| JP | 2017-120831 | | 7/2017 |

\* cited by examiner

ND METHOD
SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2017-167063, filed on Aug. 31, 2017; the entire contents of which are incorporated herein by reference.

FIELD

Embodiments described herein relate generally to a semiconductor device and a method for manufacturing a semiconductor device.

BACKGROUND

A structure of a three-dimensional memory has been proposed in which a source layer provided under a stacked body including multiple electrode layers contacts sidewalls of channel bodies piercing the stacked body.

DETAILED DESCRIPTION

Figure 1:
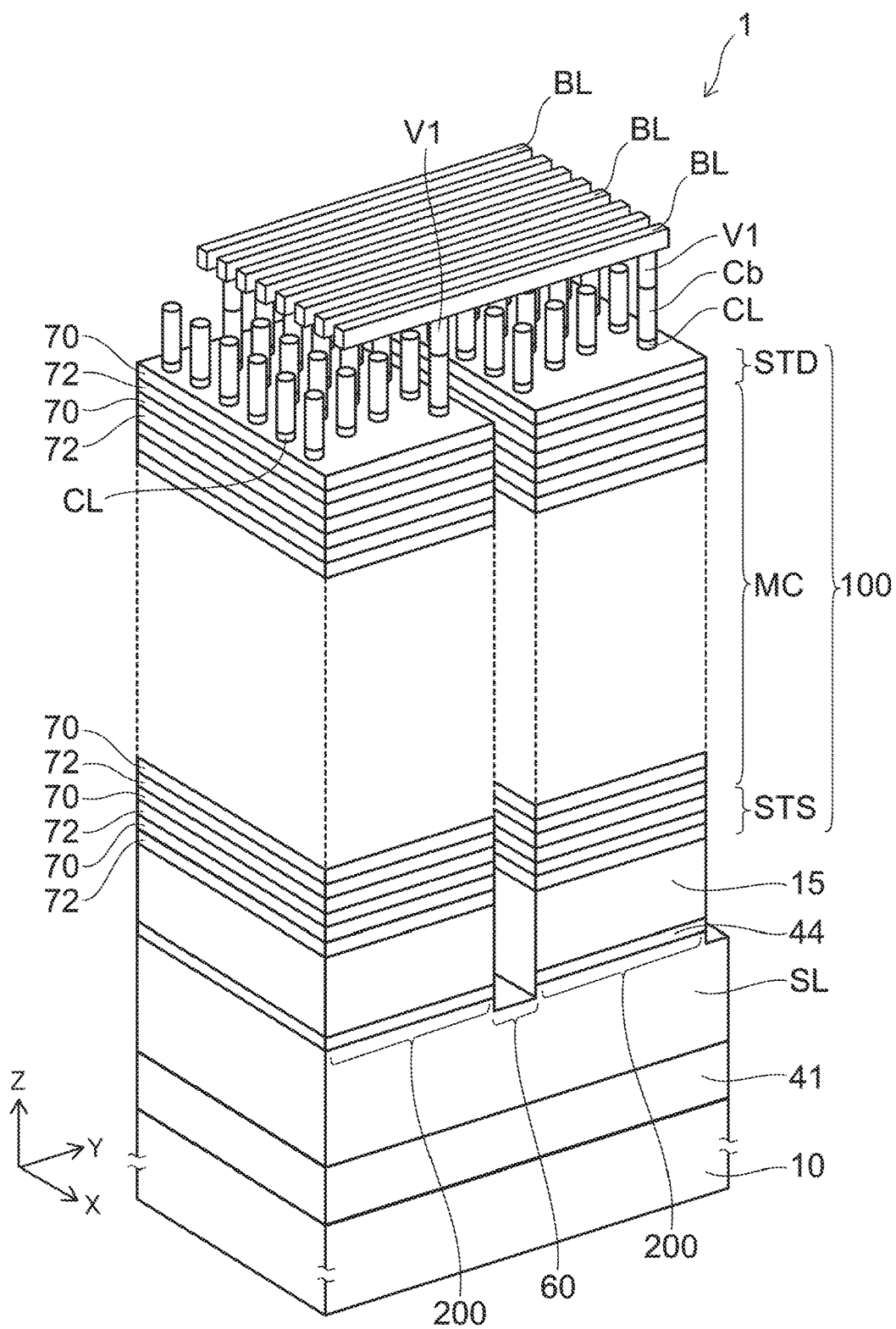
FIG. 1 is a schematic perspective view of a semiconductor device of an embodiment.

According to one embodiment, a semiconductor device includes a source layer, a stacked body, a plurality of separation portions, a plurality of columnar portions, and a dopant diffusion prevention film. The source layer includes a semiconductor layer including a dopant. The stacked body is provided on the source layer. The stacked body includes a plurality of electrode layers stacked with an insulator interposed. The separation portions extend through the stacked body in a stacking direction of the stacked body and divide the stacked body into a plurality of blocks. The columnar portions are disposed in an area between the separation portions. The columnar portions extend in the stacking direction through the stacked body and through the semiconductor layer. The columnar portions include a plurality of semiconductor bodies including sidewall portions contacting the semiconductor layer. The dopant diffusion prevention film is provided inside the semiconductor layer and separated from the columnar portions in an area between the columnar portions. The dopant diffusion prevention film is not provided inside the semiconductor layer in an area between the separation portion and the columnar portions.

Hereinafter, embodiments will be described with reference to the drawings. Incidentally, in the respective drawings, the same components are denoted by the same reference numerals.

In an embodiment, for example, a semiconductor memory device that includes a memory cell array having a three-dimensional structure is described as a semiconductor device.

FIG. 1 is a schematic perspective view of a memory cell array 1 of an embodiment.

Figure 2:
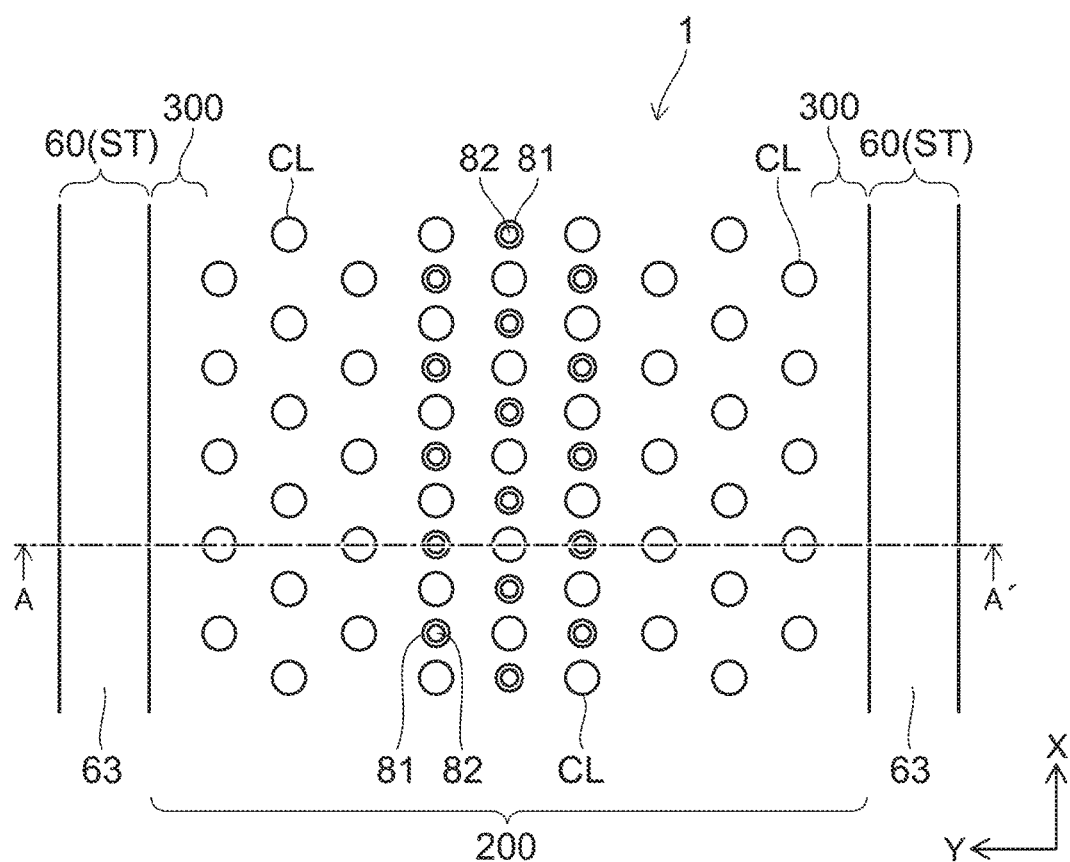
FIG. 2 is a schematic plan view of the semiconductor device of the embodiment.

FIG. 2 is a schematic plan view of the memory cell array 1.

Figure 3:
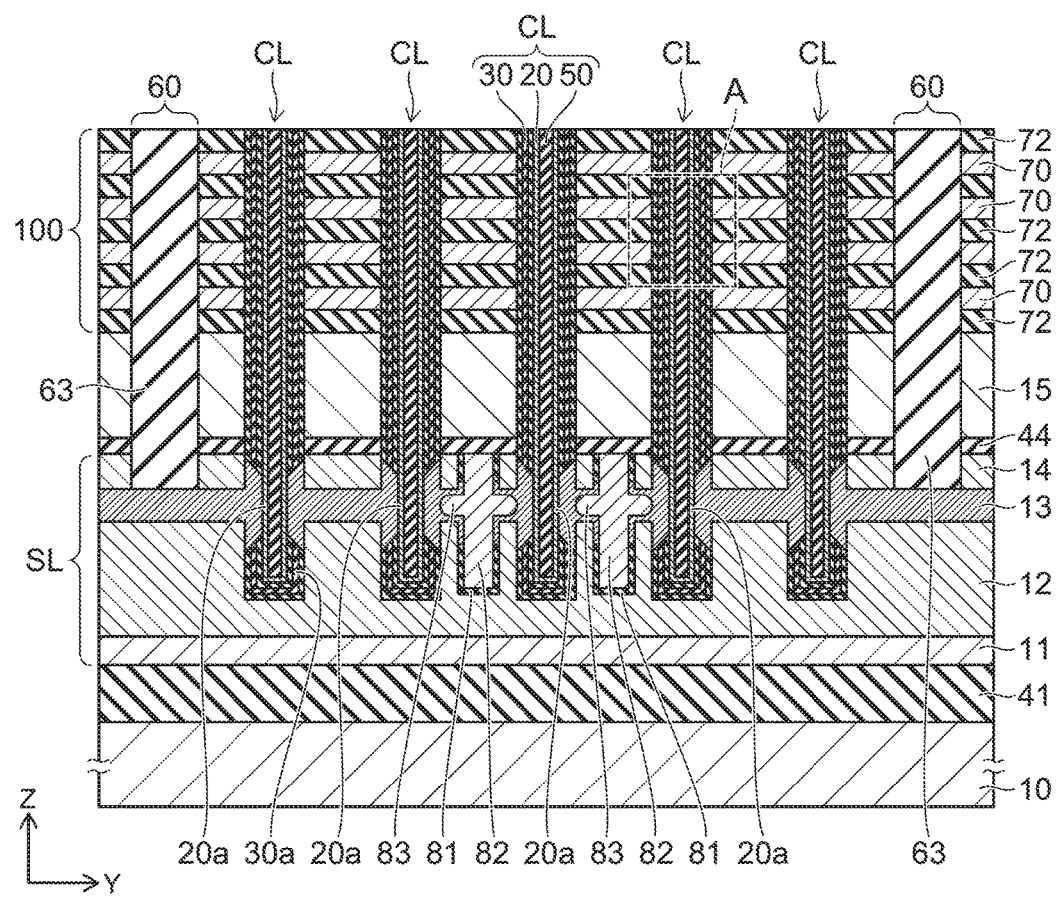
FIG. 3 is an A-A' cross-sectional view of FIG. 2.

FIG. 3 is an A-A' cross-sectional view of FIG. 2.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction of the other drawings correspond respectively to the X-direction, the Y-direction, and the Z-direction of FIG. 1.

The memory cell array 1 includes a source layer SL, a stacked body 100 provided on the source layer SL, multiple columnar portions CL, multiple separation portions 60, and multiple bit lines BL provided above the stacked body 100. The source layer SL is provided on the substrate 10 with an insulating layer 41 interposed. The substrate 10 is, for example, a silicon substrate. A gate layer 15 is provided between the source layer SL and the stacked body 100.

The columnar portions CL are formed in substantially circular columnar configurations extending in the stacking direction (the Z-direction) through the stacked body 100. The columnar portions CL further pierce the gate layer 15 under the stacked body 100 and reach the source layer SL. The multiple columnar portions CL have, for example, a staggered arrangement. Or, the multiple columnar portions CL may have a square lattice arrangement along the X-direction and the Y-direction.

The separation portions 60 divide the stacked body 100 and the gate layer 15 into multiple blocks (or fingers) in the Y-direction. The separation portions 60 have a structure in which an insulating film 63 is filled into a slit ST shown in FIG. 20 described below.

The multiple bit lines BL extend in the Y-direction and are, for example, metal films. The multiple bit lines BL are separated from each other in the X-direction.

The upper end portion of a semiconductor body 20 of the columnar portion CL described below is connected to the bit line BL via a contact Cb and a contact V1 shown in FIG. 1.

As shown in FIG. 3, the source layer SL includes semiconductor layers 12 to 14, and a layer 11 that includes a metal.

The layer 11 that includes the metal is provided on the insulating layer 41. The layer 11 that includes the metal is, for example, a tungsten layer or a tungsten silicide layer.

The semiconductor layer 12 is provided on the layer 11 including the metal; the semiconductor layer 13 is provided on the semiconductor layer 12; and the semiconductor layer 14 is provided on the semiconductor layer 13.

The semiconductor layers 12 to 14 include a dopant and are polycrystalline silicon layers that are conductive. The semiconductor layers 12 to 14 are, for example, polycrystalline silicon layers doped with phosphorus.

An insulating layer 44 is provided on the semiconductor layer 14; and the gate layer 15 is provided on the insulating layer 44. The gate layer 15 includes a dopant and is a polycrystalline silicon layer that is conductive. The gate layer 15 is, for example, a polycrystalline silicon layer doped with phosphorus.

The stacked body 100 is provided on the gate layer 15. The stacked body 100 includes multiple electrode layers 70 stacked in a direction (the Z-direction) perpendicular to the major surface of the substrate 10. Insulating layers (insulating bodies) 72 are provided between the electrode layers 70 adjacent to each other above and below. The insulating layer 72 is provided between the gate layer 15 and the electrode layer 70 of the lowermost layer.

The electrode layer 70 is a metal layer. The electrode layer 70 is, for example, a tungsten layer including tungsten as a major component, or a molybdenum layer including molybdenum as a major component. The insulating layer 72 is a silicon oxide layer including silicon oxide as a major component.

Among the multiple electrode layers 70, the electrode layer 70 of at least the uppermost layer is a control gate (a drain-side selection gate) of a drain-side selection transistor STD (FIG. 1); and the electrode layer 70 of at least the lowermost layer is a control gate (a source-side selection gate) of a source-side selection transistor STS (FIG. 1). For example, the electrode layers 70 of multiple layers on the lower layer side including the electrode layer 70 of the lowermost layer are the source-side selection gate. Multiple layers may be provided also for the drain-side selection gate.

Multiple layers of electrode layers 70 are provided as cell gates between the drain-side selection gate and the source-side selection gate.

The gate layer 15 is thicker than the thickness of one layer of the electrode layers 70 and the thickness of one layer of the insulating layers 72.

The multiple columnar portions CL extend in the stacking direction through the stacked body 100 and further pierce the gate layer 15, the insulating layer 44, the semiconductor layer (the third semiconductor layer) 14, and the semiconductor layer (the second semiconductor layer) 13 and reach the semiconductor layer (a first semiconductor layer) 12.

Figure 4:
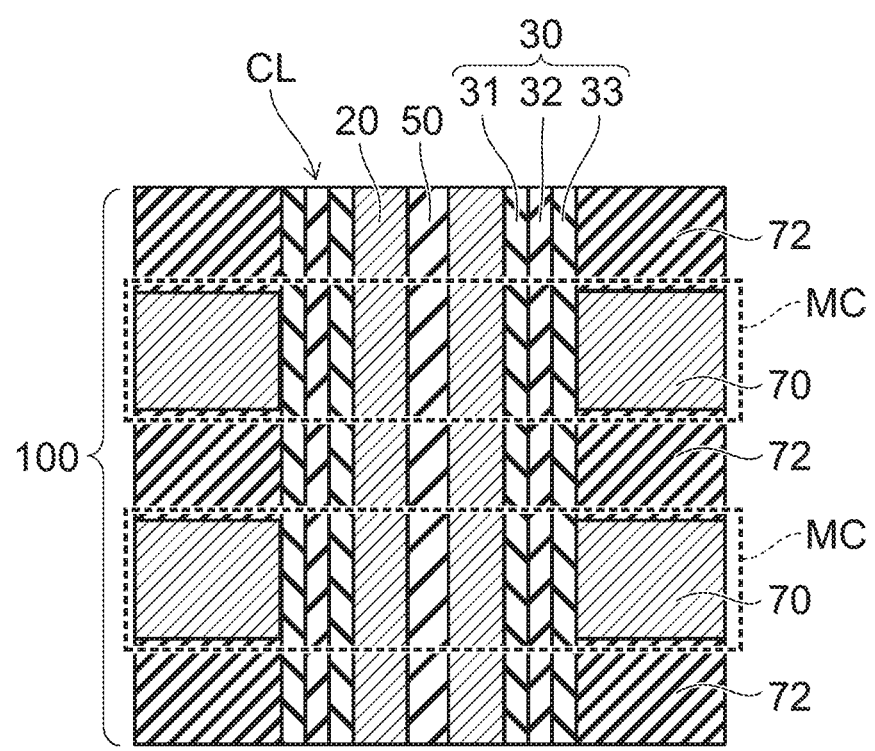
FIG. 4 is an enlarged cross-sectional view of portion A of FIG. 3.

FIG. 4 is an enlarged cross-sectional view of portion A of FIG. 3.

The columnar portion CL includes a memory film 30, the semiconductor body 20, and an insulative core film 50. The memory film 30 is a stacked film of insulating films including a tunneling insulating film 31, a charge storage film (a charge storage portion) 32, and a blocking insulating film 33.

As shown in FIG. 3, the semiconductor body 20 is formed in a pipe-like configuration extending to be continuous in the Z-direction through the stacked body 100 and through the gate layer 15, and reaches the source layer SL. The core film 50 is provided on the inner side of the semiconductor body 20 having the pipe-like configuration.

The upper end portion of the semiconductor body 20 is connected to the bit line BL via the contact Cb and the contact V1 shown in FIG. 1. As shown in FIG. 3, a sidewall portion 20a that is on the lower end side of the semiconductor body 20 contacts the semiconductor layer 13 of the source layer SL.

The memory film 30 is provided between the stacked body 100 and the semiconductor body 20 and between the gate layer 15 and the semiconductor body 20, and surrounds the semiconductor body 20 from the outer perimeter side.

The memory film 30 extends to be continuous in the Z-direction through the stacked body 100 and through the gate layer 15. The memory film 30 is not provided at the sidewall portion (the source contact portion) 20a of the semiconductor body 20 contacting the semiconductor layer 13. The sidewall portion 20a is not covered with the memory film 30.

The lower end portion of the semiconductor body 20 is continuous with the sidewall portion 20a, is positioned lower than the sidewall portion 20a, and is positioned inside the semiconductor layer 12. The memory film 30 is provided between the semiconductor layer 12 and the lower end portion of the semiconductor body 20. The memory film 30 is divided in the Z-direction at the position of the sidewall portion (the source contact portion) 20a of the semiconductor body 20. A lower portion 30a of the divided memory film 30 is disposed under the bottom surface of the semiconductor body 20 and at a position surrounding the lower end portion outer perimeter of the semiconductor body 20.

As shown in FIG. 4, the tunneling insulating film 31 is provided between the semiconductor body 20 and the charge storage film 32 and contacts the semiconductor body 20. The charge storage film 32 is provided between the tunneling insulating film 31 and the blocking insulating film 33. The blocking insulating film 33 is provided between the charge storage film 32 and the electrode layer 70.

The semiconductor body 20, the memory film 30, and the electrode layer 70 are included in a memory cell MC. The memory cell MC has a vertical transistor structure in which the electrode layer 70 surrounds, with the memory film 30 interposed, the periphery of the semiconductor body 20.

In the memory cell MC that has the vertical transistor structure, the semiconductor body 20 is, for example, a channel body of silicon; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of the charge from the electrode layer 70 into the columnar portion CL.

The blocking insulating film 33 includes, for example, a silicon oxide film. Or, the blocking insulating film 33 may be a stacked film of a silicon oxide film and a metal oxide film. In such a case, the silicon oxide film may be provided between the charge storage film 32 and the metal oxide film; and the metal oxide film may be provided between the silicon oxide film and the electrode layer 70. The metal oxide film is, for example, an aluminum oxide film.

As shown in FIG. 1, the drain-side selection transistor STD is provided in the upper layer portion of the stacked body 100. The source-side selection transistor STS is provided in the lower layer portion of the stacked body 100. The drain-side selection transistor STD and the source-side selection transistor STS are vertical transistors having the semiconductor body 20 as channels.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 and are included in one memory string. For example, the memory strings have a staggered arrangement in a planar direction parallel to the XY plane; and the multiple memory cells MC are provided three-dimensionally in the X-direction, the Y-direction, and the Z-direction.

The sidewall portion 20a of the semiconductor body (the silicon body) 20 contacts the semiconductor layer 13 doped with, for example, phosphorus (P); and the sidewall portion 20a also includes, for example, phosphorus. The dopant concentration of the sidewall portion 20a is higher than the dopant concentration of the portion of the semiconductor body 20 opposing the stacked body 100. The dopant concentration of the sidewall portion (the source contact portion) 20a is higher than the dopant concentration of the channel of the memory cell MC.

In a read operation, the electrons are supplied to the channels of the memory cells MC from the source layer SL via the sidewall portion 20a of the semiconductor body 20.

In the case where a dopant (e.g., phosphorus) is caused to diffuse into the portion of the semiconductor body 20 opposing the gate layer 15, the gate layer 15 can function as a GIDL (gate induced drain leakage) generator in an erase operation.

Holes are generated by applying a high electric field to the portion of the semiconductor body 20 opposing the gate layer 15 by applying an erasing potential (e.g., several volts) to the gate layer 15; the holes are supplied to the channels of the memory cells MC; and the channel potential is increased. Then, the holes are injected into the charge storage film 32 by the potential difference between the semiconductor body 20 and the electrode layers 70 by setting the potentials of the electrode layers 70 of the memory cells MC to, for example, a ground potential (0 V); and the erase operation of the data is performed.

As shown in FIG. 2, the multiple columnar portions CL are disposed in an area (a block 200) between two separation portions 60 separated from each other in the Y-direction.

Multiple semiconductor portions 82 are disposed in the Y-direction center vicinity most distal to the separation portions 60 in the area between the two separation portions 60. The semiconductor portion 82 is polycrystalline silicon having a columnar configuration. A dopant diffusion prevention film 81 is provided on the side surface of the semiconductor portion 82 having the columnar configuration. The dopant diffusion prevention film 81 is a silicon nitride film, an aluminum oxide film, or a silicon oxide film.

When the multiple columnar portions CL arranged in the X-direction are taken as one column, there are nine columns between the separation portions 60 in the example shown in FIG. 2. The semiconductor portions 82 and the dopant diffusion prevention films 81 are disposed in the area where the columnar portions CL of the three columns at the center are disposed. The semiconductor portion 82 and the dopant diffusion prevention film 81 are disposed to be separated from the columnar portions CL in the area between mutually-adjacent columnar portions CL.

As shown in FIG. 3, the semiconductor portion 82 extends in a columnar configuration through the semiconductor layers 12 to 14. The dopant diffusion prevention film 81 that is provided on the side surface of the semiconductor portion 82 is divided in the Z-direction at the portion adjacent to the semiconductor layer 13. A protrusion 83 is provided at the side surface of the semiconductor portion 82 at the portion where the dopant diffusion prevention film 81 is divided.

The semiconductor portion 82 and the protrusion 83 are polycrystalline silicon formed as one body with the semiconductor layer 13. The dopant diffusion prevention film 81 is not provided at the portions of the semiconductor portion 82 and the protrusion 83 adjacent to the semiconductor layer 13. The portions of the semiconductor portion 82 and the protrusion 83 where the dopant diffusion prevention film 81 is not provided contact the semiconductor layer 13 as one body.

As shown in FIG. 2, the semiconductor portion 82 and the dopant diffusion prevention film 81 are not disposed at the vicinity of the columns of the multiple columnar portions CL most proximal to the separation portion 60. The semiconductor portion 82 and the dopant diffusion prevention film 81 are not disposed in an area 300 between the separation portion 60 and the columnar portions CL.

A method for manufacturing the semiconductor device of the embodiment will now be described with reference to FIG. 5A to FIG. 20. The cross sections shown in FIG. 5A to FIG. 20 correspond to the cross section shown in FIG. 3.

Figure 5A:
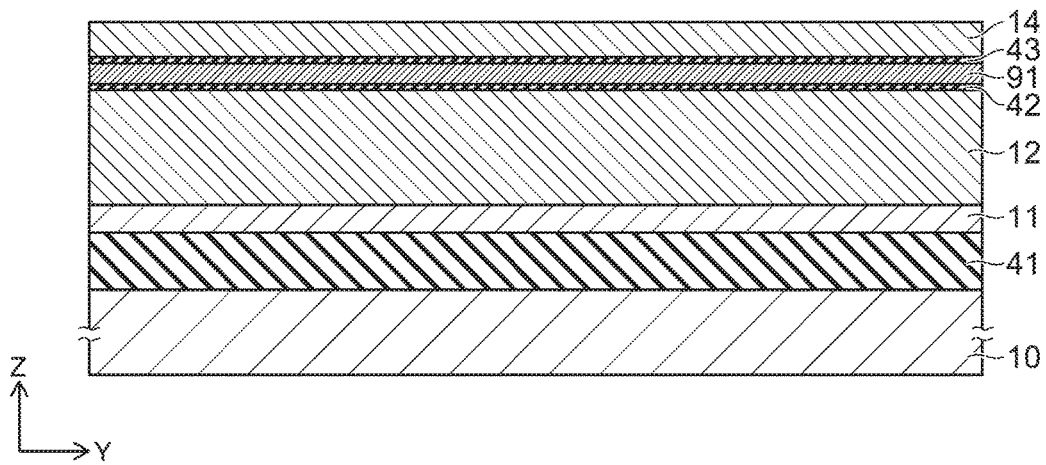
FIG. 5A to FIG. 24B are schematic cross-sectional views showing a method for manufacturing the semiconductor device of the embodiment.

As shown in FIG. 5A, the insulating layer 41 is formed on the substrate 10. The layer 11 that includes the metal is formed on the insulating layer 41. The layer 11 that includes the metal is, for example, a tungsten layer or a tungsten silicide layer.

The semiconductor layer (the first semiconductor layer) 12 is formed on the layer 11 including the metal. The semiconductor layer 12 is, for example, a polycrystalline silicon layer doped with phosphorus.

A protective film 42 is formed on the semiconductor layer 12. The protective film 42 is, for example, a silicon oxide film.

A sacrificial layer 91 is formed on the protective film 42. The sacrificial layer 91 is, for example, an undoped polycrystalline silicon layer not doped with a dopant intentionally. A protective film 43 is formed on the sacrificial layer 91. The protective film 43 is, for example, a silicon oxide film. The semiconductor layer (a second semiconductor layer) 14 is formed on the protective film 43. The semiconductor layer 14 is, for example, an undoped polycrystalline silicon layer.

Figure 5B:
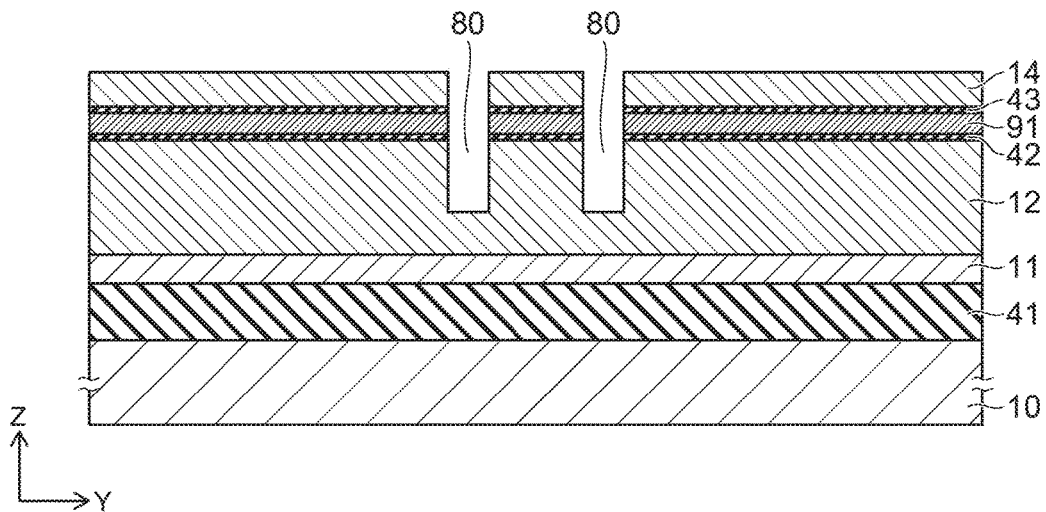

As shown in FIG. 5B, multiple holes 80 are formed in the semiconductor layer 14, the protective film 43, the sacrificial layer 91, the protective film 42, and the semiconductor layer 12.

The holes 80 are formed by RIE (reactive ion etching) using a not-illustrated mask.

The holes 80 pierce the semiconductor layer 14, the protective film 43, the sacrificial layer 91, and the protective film 42 and reach the semiconductor layer 12. The bottoms of the holes 80 are positioned inside the semiconductor layer 12.

Figure 6A:
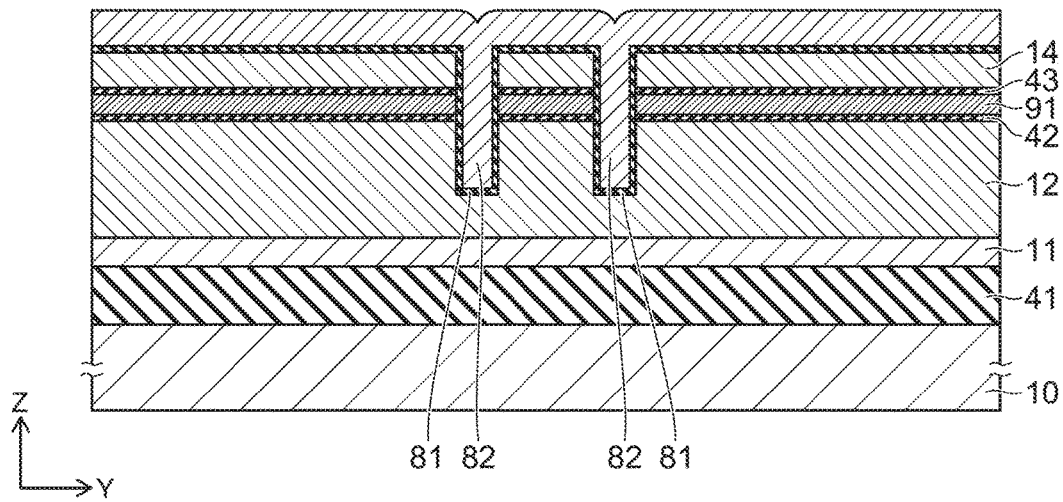

As shown in FIG. 6A, the dopant diffusion prevention film 81 is formed on the bottom surfaces and the sidewalls of the holes 80. The dopant diffusion prevention film 81 is formed conformally along the bottom surfaces and the sidewalls of the holes 80.

The dopant diffusion prevention film 81 has a blocking ability against the diffusion of the dopant (e.g., phosphorus) inside the silicon and is, for example, a silicon nitride film. Or, the dopant diffusion prevention film 81 may be an aluminum oxide film or a silicon oxide film.

After forming the dopant diffusion prevention film 81, the semiconductor portion 82 is formed inside the holes 80. The semiconductor portion 82 is formed in columnar configurations inside the holes 80. The dopant concentration of the semiconductor portion 82 is lower than the dopant concentration of the semiconductor layer 12 doped with phosphorus; and the material of the semiconductor portion 82 is undoped polycrystalline silicon.

The dopant diffusion prevention film 81 is provided between the semiconductor portion 82 and the semiconductor layer 12, between the semiconductor portion 82 and the sacrificial layer 91, and between the semiconductor portion 82 and the semiconductor layer 14.

Figure 6B:
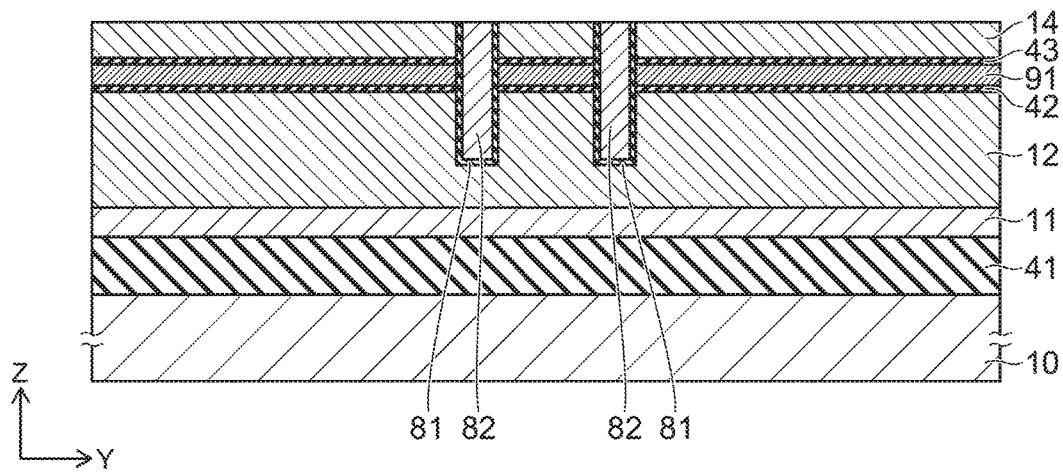

The material films of the dopant diffusion prevention film 81 and the semiconductor portion 82 deposited on the upper surface of the semiconductor layer 14 are removed by, for example, CMP (chemical mechanical polishing). As shown in FIG. 6B, the upper surface of the semiconductor layer 14, the upper surface of the dopant diffusion prevention film 81, and the upper surface of the semiconductor portion 82 are planarized.

Figure 7:
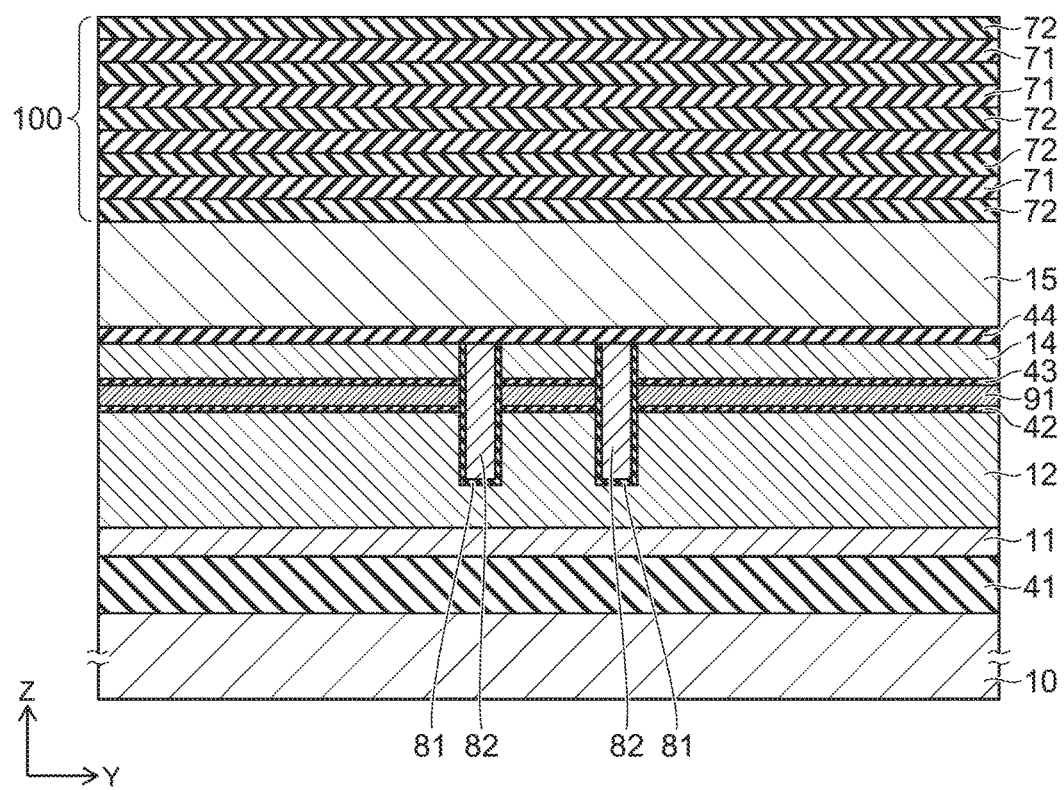

As shown in FIG. 7, the insulating layer 44 is formed on such a foundation structure in which the sacrificial layer 91 and the semiconductor portion 82 are formed inside the semiconductor layers. The insulating layer 44 is, for example, a silicon oxide layer. The gate layer 15 is formed on the insulating layer 44. The gate layer 15 is, for example, a polycrystalline silicon layer doped with phosphorus.

The stacked body 100 is formed on the gate layer 15. An insulating layer (a second layer) 72 and a sacrificial layer (a first layer) 71 are stacked alternately on the gate layer 15. The multiple sacrificial layers 71 and the multiple insulating layers 72 are formed on the gate layer 15 by repeating the process of alternately stacking the insulating layer 72 and the sacrificial layer 71. For example, the sacrificial layer 71 is a silicon nitride layer; and the insulating layer 72 is a silicon oxide layer.

The thickness of the gate layer 15 is thicker than the thickness of one layer of the sacrificial layers 71 and the thickness of one layer of the insulating layers 72.

Figure 8:
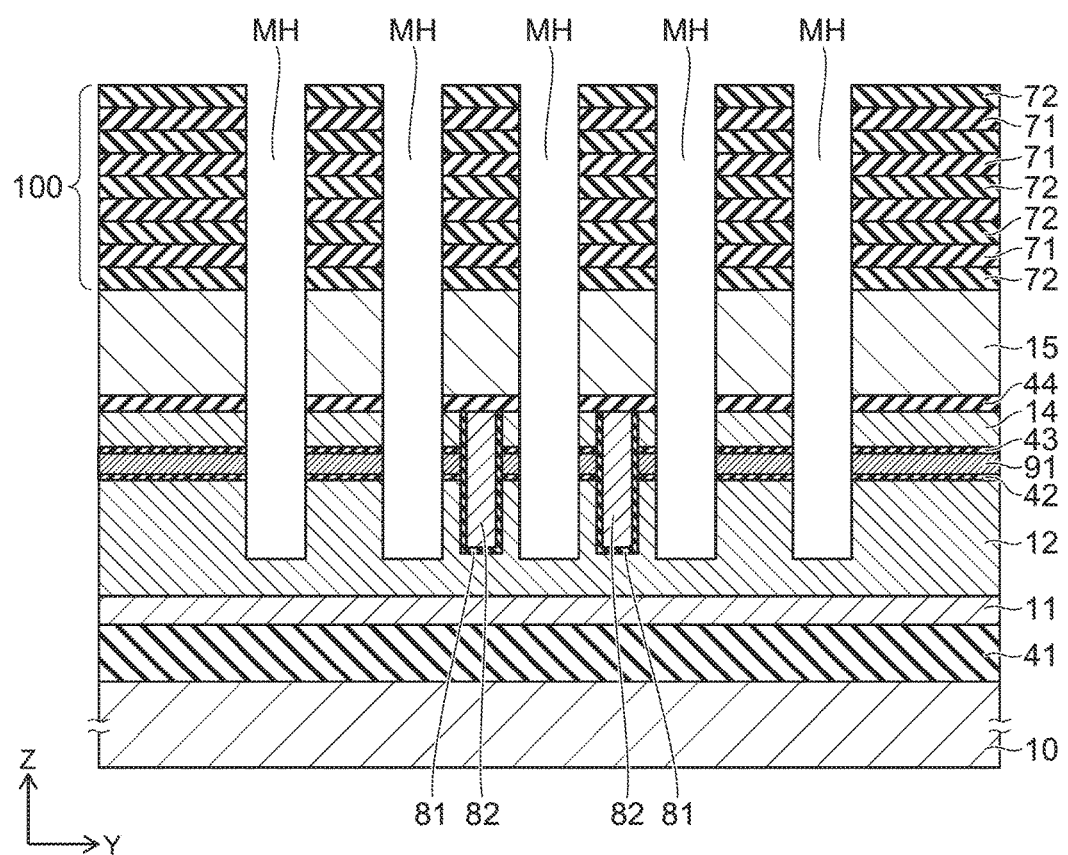

As shown in FIG. 8, for example, multiple memory holes MH are formed by RIE using a not-illustrated mask. The memory holes MH are formed at positions not interfering with the semiconductor portions 82 having the columnar configurations.

The memory holes MH pierce the stacked body 100, the gate layer 15, the insulating layer 44, the semiconductor layer 14, the protective film 43, the sacrificial layer 91, and the protective film 42 and reach the semiconductor layer 12. The bottoms of the memory holes MH are positioned inside the semiconductor layer 12.

The multiple sacrificial layers (the silicon nitride layers) 71 and the multiple insulating layers (the silicon oxide layers) 72 are etched continuously using the same gas (e.g., a CF-based gas) without switching the gas type. At this time, the gate layer (the polycrystalline silicon layer) 15 functions as an etching stopper; and the etching is stopped once at the position of the gate layer 15. The etching rate fluctuation between the multiple memory holes MH is absorbed by the thick gate layer 15; and the fluctuation of the bottom position between the multiple memory holes MH is reduced.

Subsequently, step etching of the gate layer 15 and the layers lower than the gate layer 15 is performed by switching the gas type. The etching is stopped partway through the semiconductor layer 12.

By the thick gate layer 15, the control of the etching stop position of the high-aspect ratio hole patterning of the stacked body 100 is easy.

Figure 9:
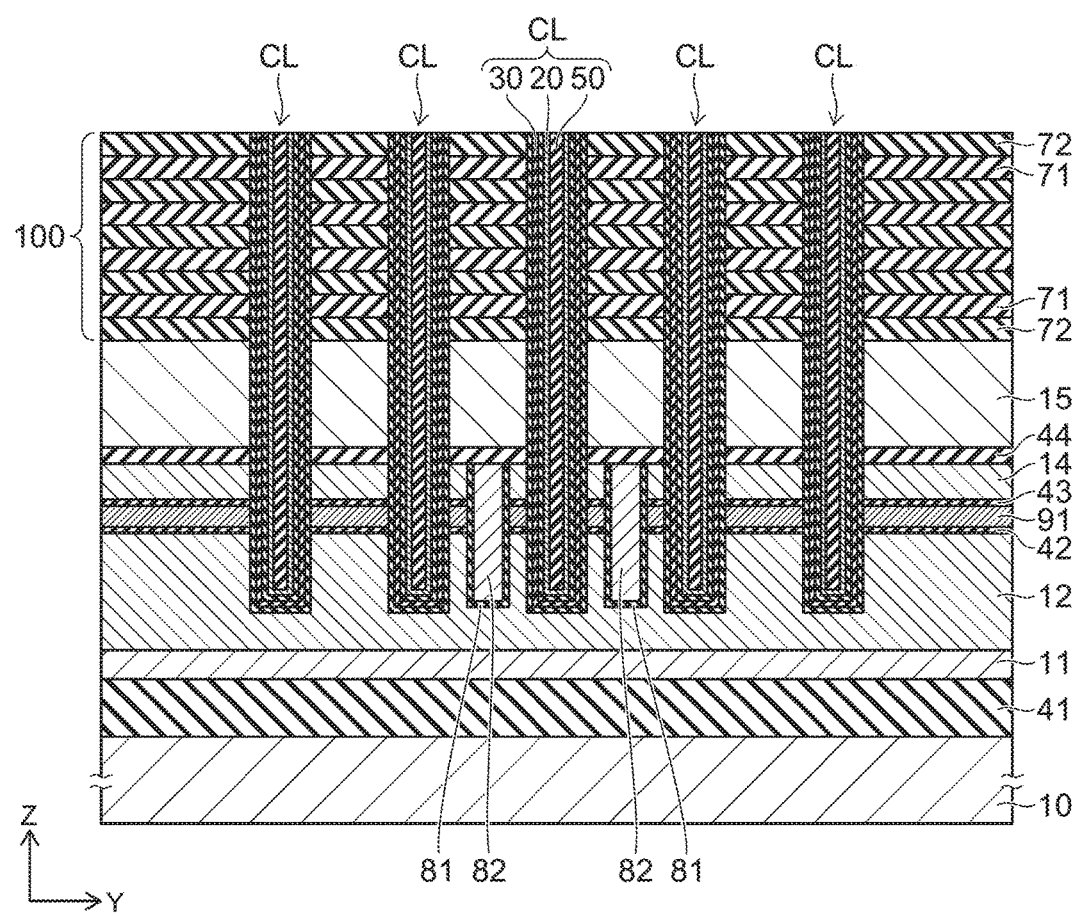

As shown in FIG. 9, the columnar portions CL are formed inside the memory holes MH. The memory film 30 is formed conformally along the side surfaces and the bottom surfaces of the memory holes MH; the semiconductor body 20 is formed conformally along the memory film 30 on the inner side of the memory film 30; and the core film 50 is formed on the inner side of the semiconductor body 20.

Figure 10:
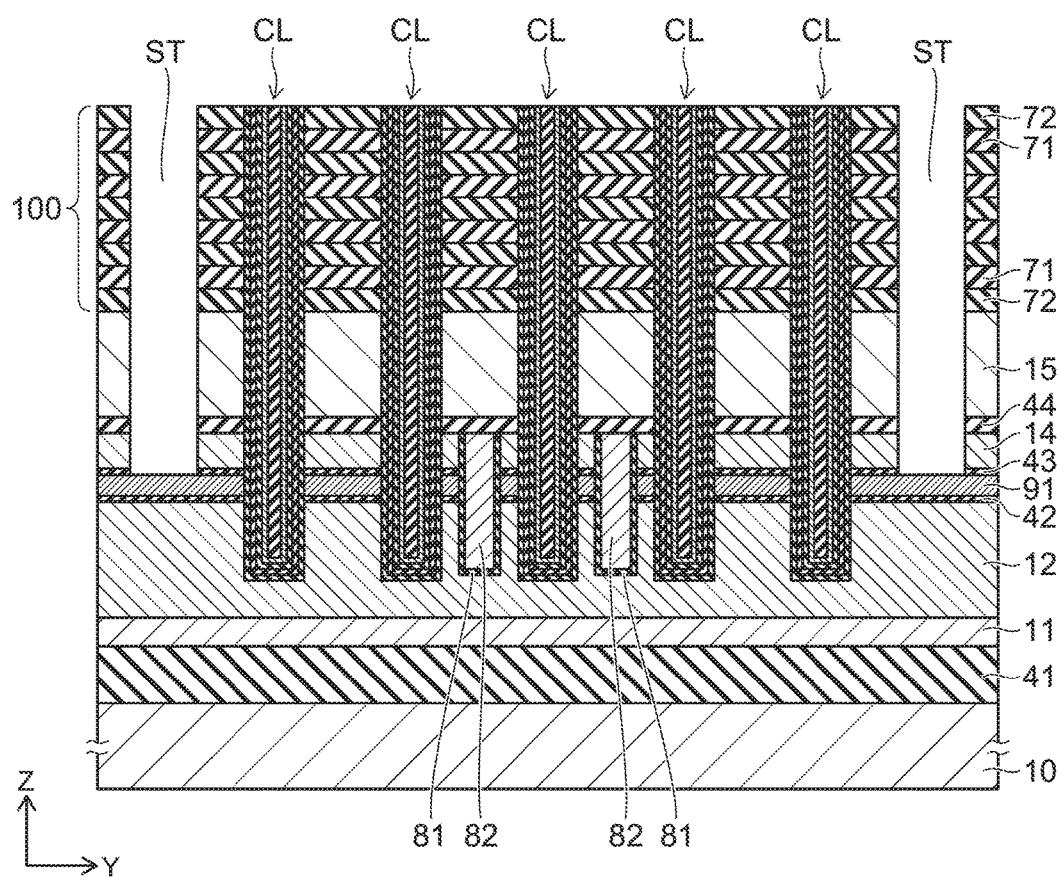

Subsequently, as shown in FIG. 10, the multiple slits ST are formed in the stacked body 100. The slits ST are formed by RIE using a not-illustrated mask.

The slits ST pierce the stacked body 100, the gate layer 15, the insulating layer 44, the semiconductor layer 14, and the protective film 43 and reach the sacrificial layer 91.

Similarly to the formation of the memory holes MH, the multiple sacrificial layers 71 and the multiple insulating layers are etched continuously using the same gas without switching the gas type. At this time, the gate layer 15 functions as an etching stopper; and the etching of the slit patterning is stopped once at the position of the gate layer 15. By the thick gate layer 15, the etching rate fluctuation between the multiple slits ST is absorbed; and the fluctuation of the bottom position between the multiple slits ST is reduced.

Subsequently, step etching of the gate layer 15 and the layers lower than the gate layer 15 is performed by switching the gas type; and the sacrificial layer 91 is exposed at the bottoms of the slits ST.

By the thick gate layer 15, the control of the etching stop position of the high-aspect ratio slit patterning of the stacked body 100 is easy. Further, in the subsequent step etching, the bottom position control of the slits ST is performed easily and with high precision. The bottoms of the slits ST stop inside the sacrificial layer 91 without the slits ST extending through the sacrificial layer 91.

The multiple semiconductor portions 82 are positioned at least at the peripheries of the columnar portions disposed in the region most distal to the slits ST. The semiconductor portions 82 are not disposed at the peripheries of the columnar portions CL most proximal to the slits ST.

Figure 11:
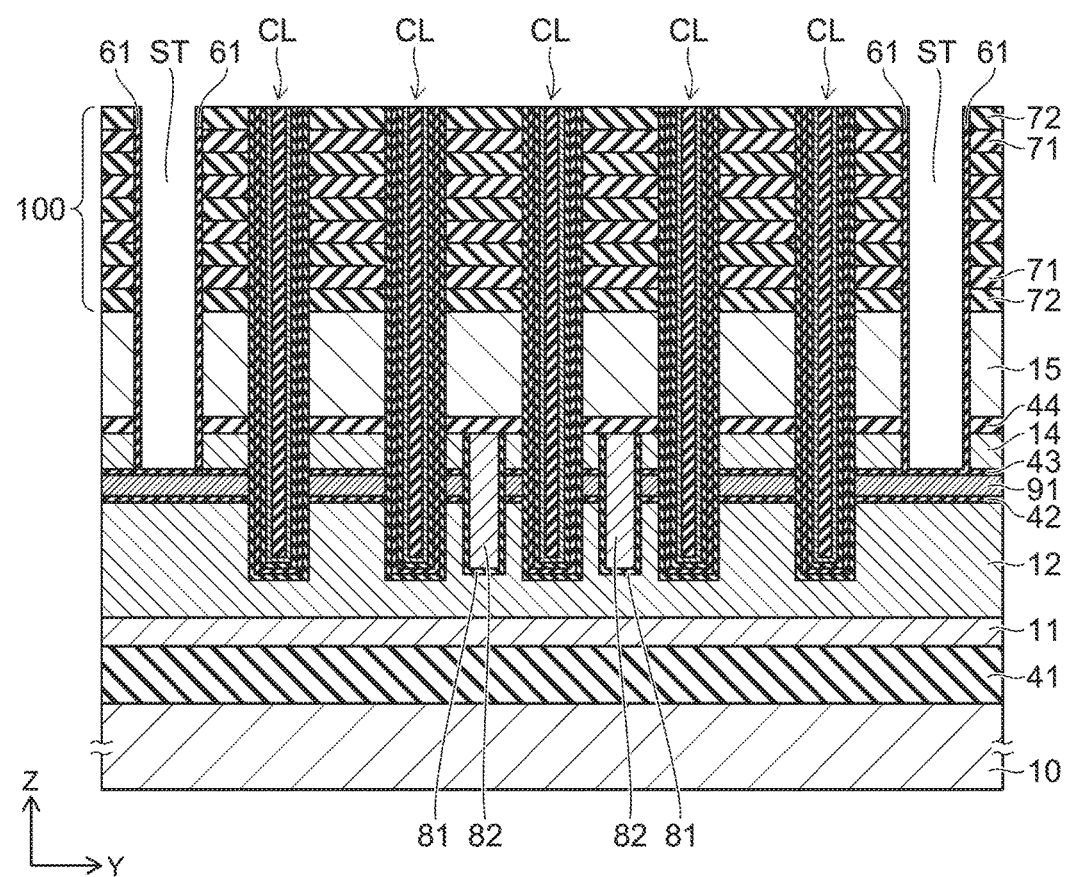
Figure 12:
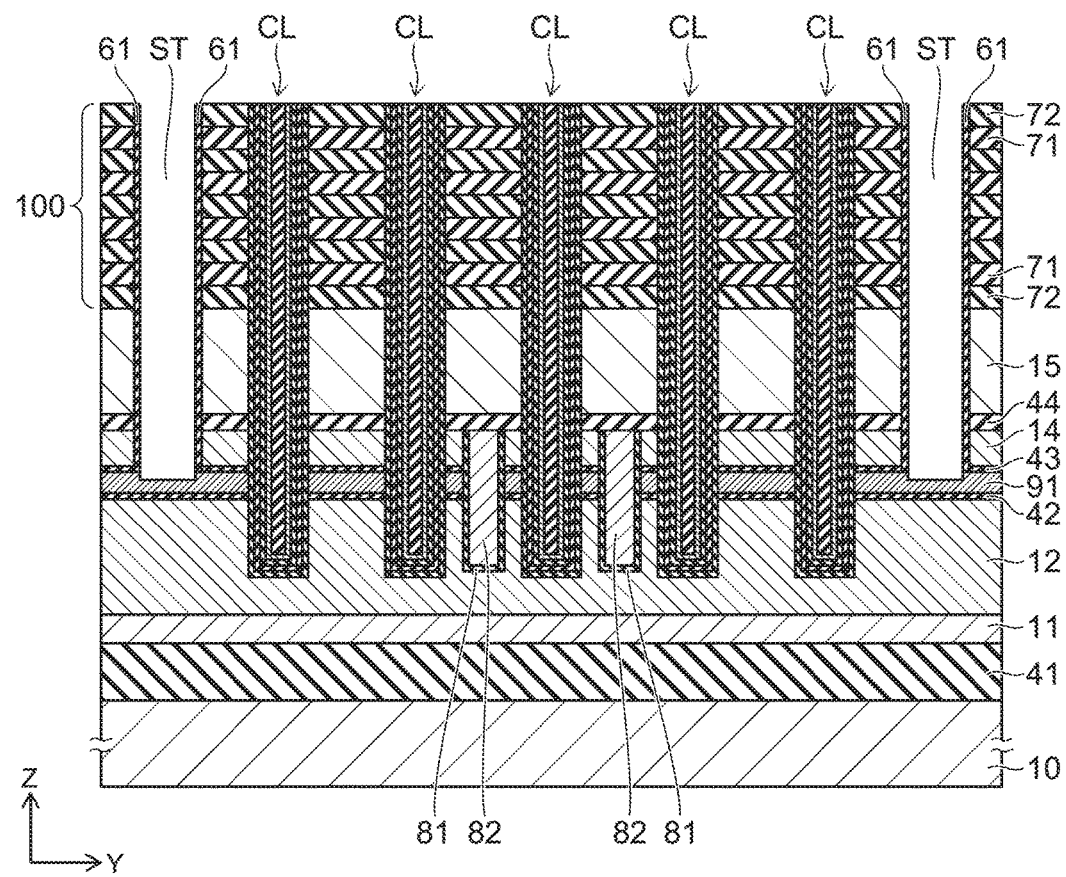

As shown in FIG. 11, a liner film 61 is formed conformally along the side surfaces and the bottom surfaces of the slits ST. The liner film 61 is, for example, a silicon nitride film. For example, the liner film 61 that is formed on the bottom surfaces of the slits ST is removed by RIE. As shown in FIG. 12, the sacrificial layer 91 is exposed at the bottoms of the slits ST.

Then, the sacrificial layer 91 is removed by etching through the slits ST. For example, the sacrificial layer 91 which is a polycrystalline silicon layer is removed by supplying hot TMY (trimethyl-2 hydroxyethyl ammonium hydroxide) through the slits ST.

Figure 13:
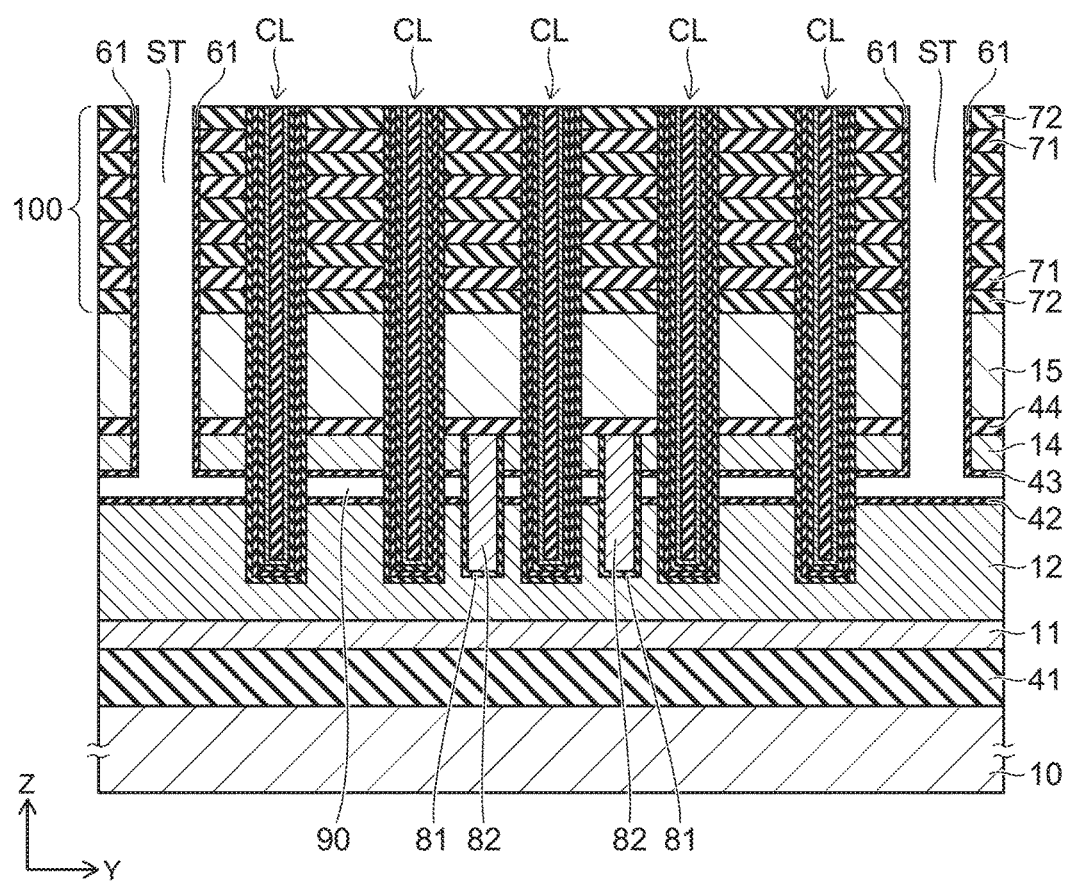

The sacrificial layer 91 is removed; and an air gap 90 is formed between the semiconductor layer 12 and the semiconductor layer 14 as shown in FIG. 13. For example, the protective films 42 and 43 which are silicon oxide films protect the semiconductor layers 12 and 14 from the etching by hot TMY. The liner film (e.g., the silicon nitride film) 61 that is formed on the side surfaces of the slits ST prevents side etching of the gate layer 15 and the semiconductor layer 14 from the slit ST side.

A portion of the sidewall of the columnar portion CL is exposed in the air gap 90. In other words, a portion of the memory film 30 is exposed. A portion of the dopant diffusion prevention film 81 formed at the side surface of the semiconductor portion 82 also is exposed in the air gap 90.

The portion of the dopant diffusion prevention film 81 exposed in the air gap 90 is removed by etching through the slits ST. For example, the dopant diffusion prevention film 81 is etched by CDE (chemical or conformal dry etching).

By setting the thickness of the liner film 61 of the same type of material as the dopant diffusion prevention film 81 (e.g., silicon nitride) to be thicker than the thickness of the dopant diffusion prevention film 81, the dopant diffusion prevention film 81 that is exposed in the air gap 90 can be removed while causing the liner film 61 exposed in the slits ST to remain.

Figure 14:
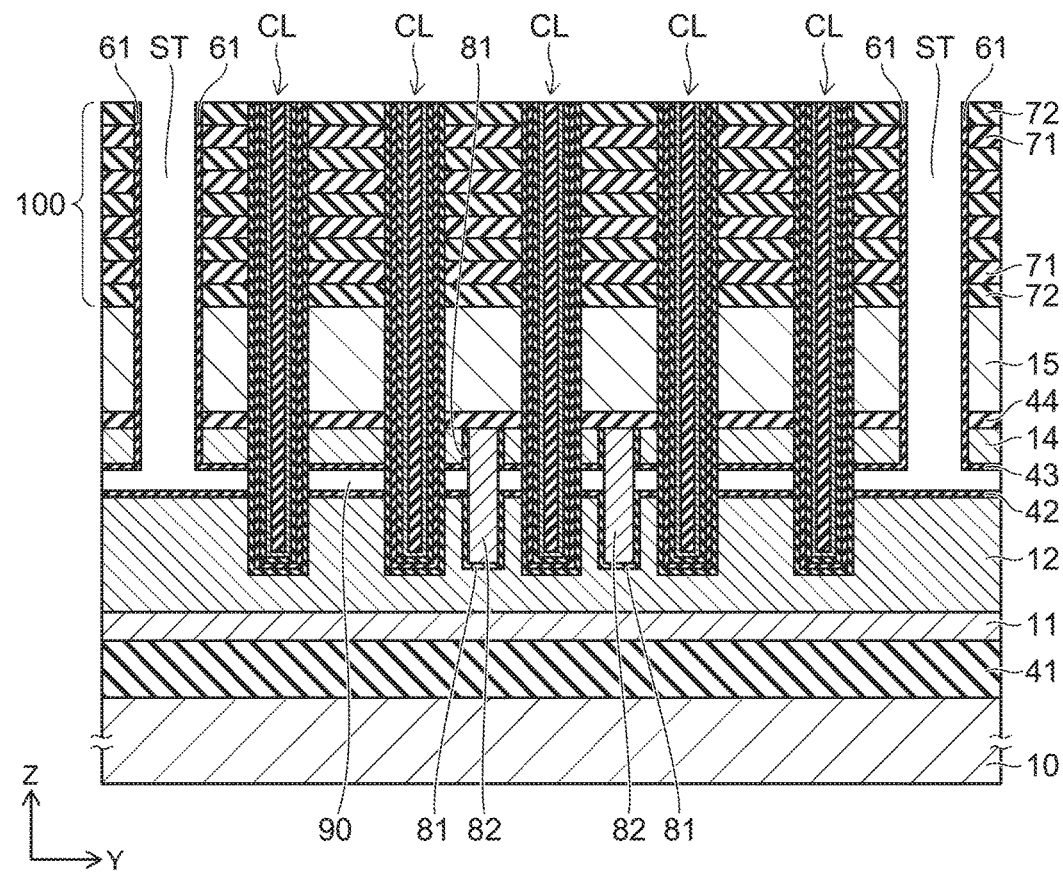

The portion of the dopant diffusion prevention film 81 covering the side surface of the semiconductor portion 82 is removed; and a portion of the side surface of the semiconductor portion 82 is exposed in the air gap 90 as shown in FIG. 14.

Figure 15:
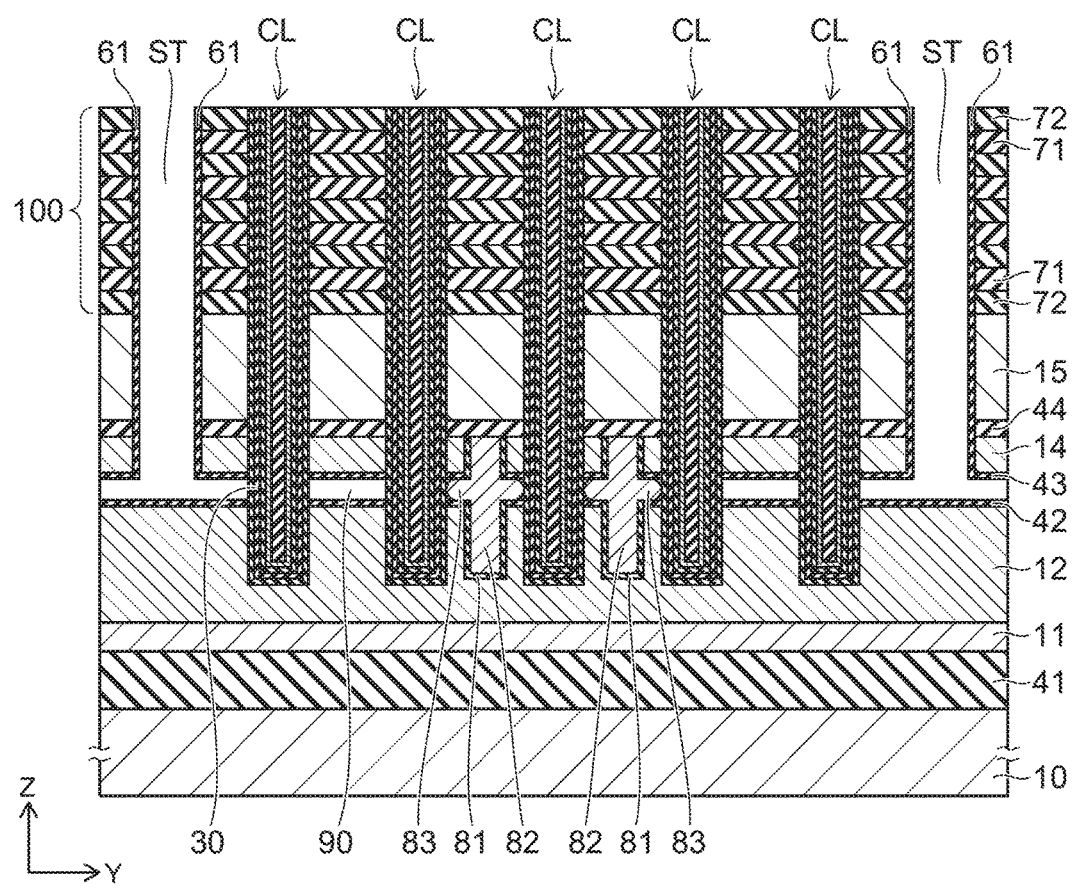

Then, a source gas of silicon is supplied to the interior of the air gap 90 through the slits ST; and a silicon material is epitaxially grown on the side surface of the semiconductor portion 82 exposed in the air gap 90. The silicon material grows in the diametral direction (the planar direction) orthogonal to the axis direction of the semiconductor portion 82 from the side surface of the semiconductor portion 82 having the columnar configuration; and the protrusion 83 is formed at the periphery of the semiconductor portion 82 as shown in FIG. 15.

When performing the epitaxial growth, a dopant is not introduced to the air gap 90; and the protrusion 83 is formed as the same undoped polycrystalline silicon as the semiconductor portion 82.

After growing the protrusion 83, the memory film 30 of the columnar portion CL exposed in the air gap 90 is removed by etching (e.g., CDE) through the slits ST. At this time, the protective films 42 and 43 which are the same types of films as the films included in the memory film 30 also are removed. Although the liner film 61 that is formed on the side surfaces of the slits ST is, for example, the same type of silicon nitride film as the charge storage film 32 included in the memory film 30, the film thickness of the liner film 61 is thicker than the film thickness of the charge storage film 32; and the liner film 61 remains on the side surfaces of the slits ST.

The liner film 61 prevents side etching from the slit ST side of the sacrificial layers 71, the insulating layers 72, and the insulating layer 44 of the stacked body 100 when removing the portion of the memory film 30 recited above exposed in the air gap 90. Because the lower surface of the insulating layer 44 is covered with the semiconductor layer 14, etching is prevented also from the lower surface side of the insulating layer 44.

Figure 16:
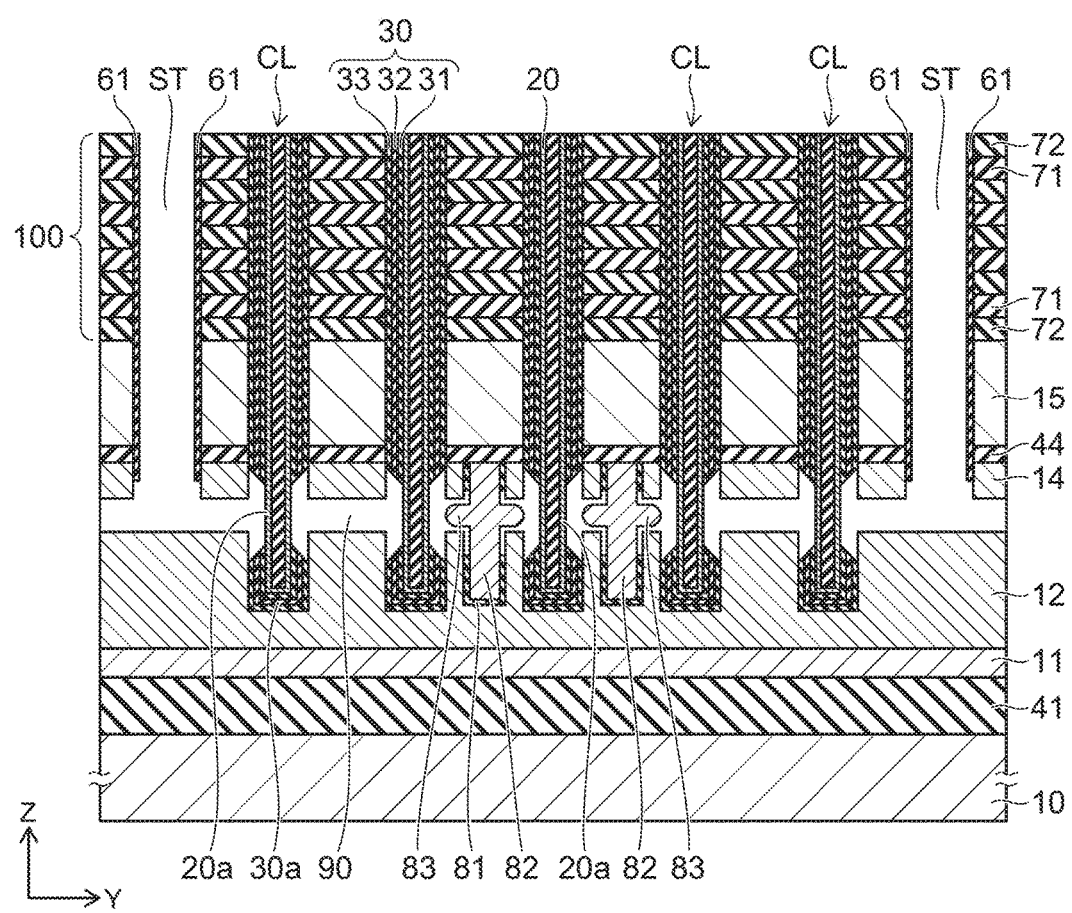

A portion of the memory film 30 is removed from the air gap 90; and the memory film 30 is divided in the stacking direction (the Z-direction) as shown in FIG. 16. By controlling the etching time, the memory film (the gate insulating film) 30 that is between the gate layer 15 and the semiconductor body 20 is not etched.

Also, by controlling the etching time, the lower portion 30a of the memory film 30 lower than the air gap 90 remains inside the semiconductor layer 12. The lower end portion of the columnar portion CL remains inside the semiconductor layer 12 as an anchor. The semiconductor layer 12 surrounds the lower end portions of the columnar portions CL and maintains a stable support state of the columnar portions CL in the state in which the air gap 90 is formed.

The portion of the memory film 30 recited above is removed; and a portion (the sidewall portion 20a) of the semiconductor body 20 is exposed in the air gap 90 as shown in FIG. 16. The lower surface of the semiconductor layer 14 and the upper surface of the semiconductor layer 12 also are exposed in the air gap 90 by removing the protective films 42 and 43.

In other words, the sidewall portion 20a of the semiconductor body 20, a portion (the protrusion 83) of the semiconductor portion 82, the lower surface of the semiconductor layer 14, and the upper surface of the semiconductor layer 12 are exposed in the air gap 90. Among these components, the semiconductor layer 12 is phosphorus-doped polycrystalline silicon; and the sidewall portion 20a of the semiconductor body 20, the semiconductor portion 82 (also including the protrusion 83), and the semiconductor layer 14 have dopant concentrations lower than that of the semiconductor layer 12, and are substantially undoped polycrystalline silicon.

In other words, a phosphorus-doped first semiconductor portion (the semiconductor layer 12) and an undoped second semiconductor portion (the sidewall portion 20a of the semiconductor body 20, the semiconductor portion 82, and the semiconductor layer 14) exist in the polycrystalline silicon exposed in the air gap 90.

There are cases where high-temperature annealing also is used when forming the films included in the columnar portion CL in the process shown in FIG. 9 described above. At this time, the diffusion of the dopant (the phosphorus) from the semiconductor layer 12 into the semiconductor portion 82 can be prevented because the dopant diffusion prevention film 81 is formed between the semiconductor layer 12 and the semiconductor portion 82.

Figure 18:
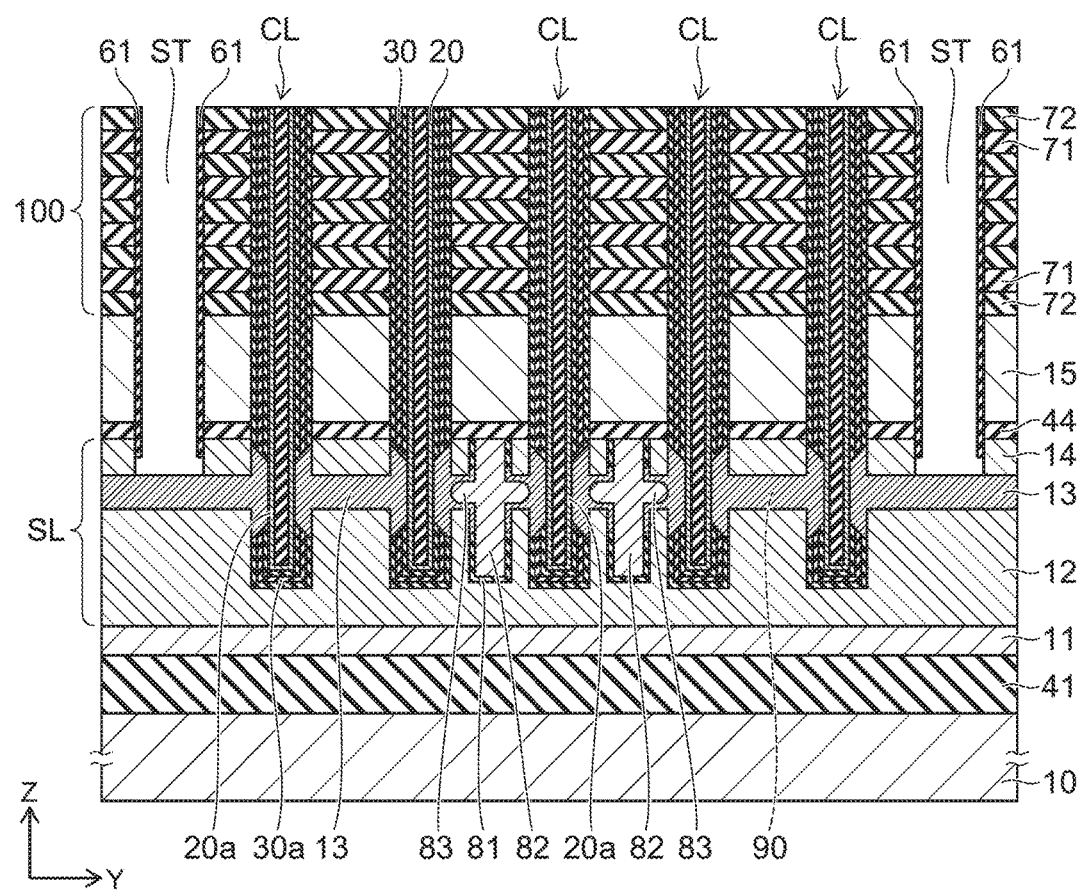

A source gas (a film formation gas) of silicon is supplied to the interior of the air gap 90 through the slits ST; and a silicon material is epitaxially grown from the first semiconductor portion and the second semiconductor portion exposed in the air gap 90. As shown in FIG. 18, the semiconductor layer (a third semiconductor layer) 13 is filled into the air gap 90.

Due to the microloading effect at this time, the film formation starts after a shorter incubation time (film formation start time) for regions proximal to the gas supply source (the slits ST); and a phenomenon may undesirably occur in which the air gap 90 is plugged while leaving voids (or seams) in regions distal to the slits ST. In other words, in the regions distal to the gas supply source (the slits ST), compared to the regions at the slit ST vicinity, the process of progressing from surface adsorption of the gas components to deposition is delayed easily due to insufficient gas.

In the case where the voids inside the semiconductor layer 13 undesirably move to the contact portion between the semiconductor body 20 and the semiconductor layer 13 due to migration in subsequent annealing processes, the voids may cause electrical contact defects between the semiconductor body 20 and the semiconductor layer 13 (the source layer).

Conversely, according to the embodiment, the silicon portions that are exposed in the air gap 90 have a dopant concentration difference.

Figure 36:
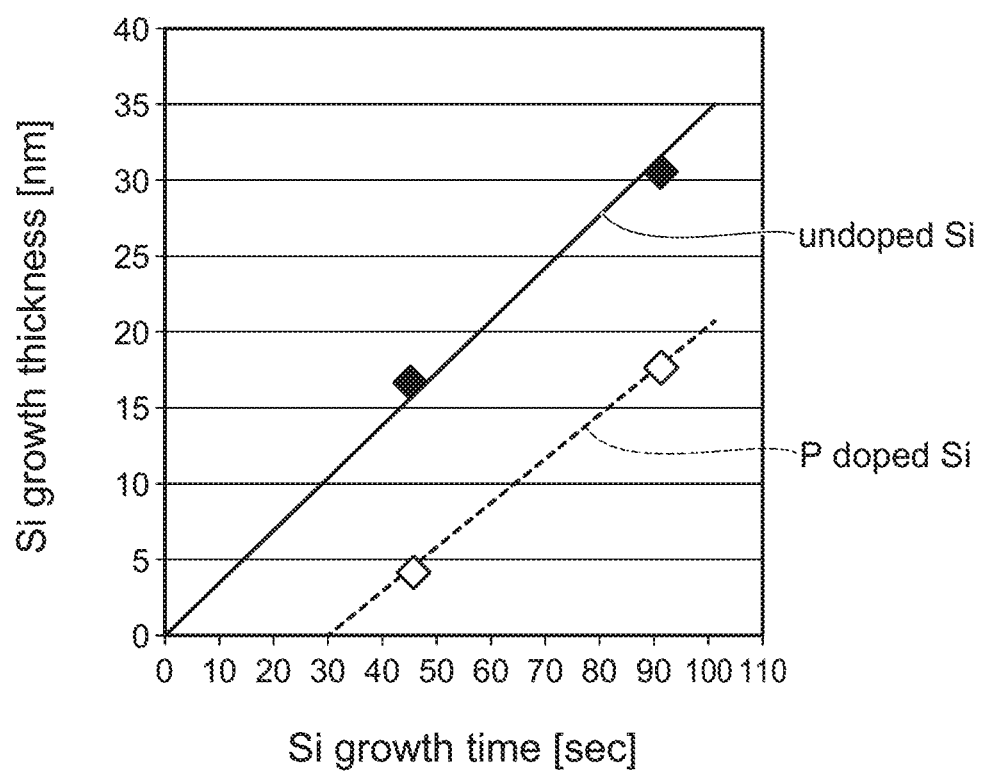
FIG. 36 is a graph illustrating a relationship between thickness and time of a silicon growth.

FIG. 36 is a graph illustrating the relationship between the thickness (the vertical axis) and the time (the horizontal axis) of the silicon growth.

The broken line illustrates the incubation time of silicon grown from phosphorus-doped silicon (a phosphorus concentration of about $10^{20}$ atoms/cm$^{-3}$).

The solid line illustrates the incubation time of silicon grown from undoped silicon.

For a constant amount of time directly after starting the gas supply (directly after the film formation start), the incubation time of the silicon grown from the undoped silicon is faster than the incubation time of the silicon grown from the phosphorus-doped silicon. In other words, in FIG. 16, the silicon starts to grow faster from the semiconductor portion 82 and the protrusion 83 of the semiconductor portion 82 which are undoped silicon than from the upper surface of the semiconductor layer 12.

Because the semiconductor portion 82 and the protrusion 83 are disposed at the peripheries of the columnar portions CL disposed in the area most distal to the slits ST (the central area between the slits ST), the growth of the silicon progresses first from the central area between the slits ST.

Figure 17:
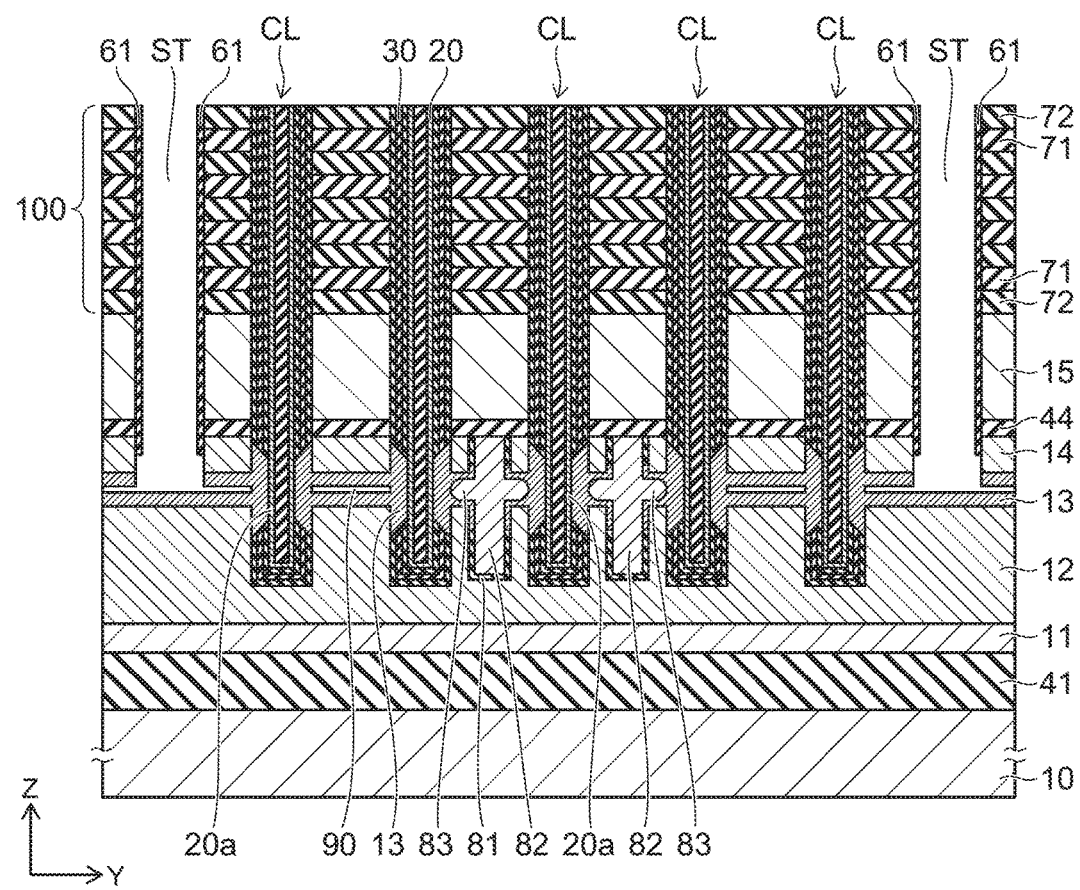

FIG. 17 is a schematic cross-sectional view illustrating a film formation intermediate state of the silicon (the semiconductor layer 13) inside the gap 90.

As shown in FIG. 17, the growth of the silicon progresses faster in the central area between the slits ST than in the area of the slit ST vicinity; and the voids (the seams) do not remain easily inside the semiconductor layer 13 of the central area. Subsequently, the growth of the silicon progresses further; and the semiconductor layer 13 is filled without voids inside the air gap 90 at the slit ST vicinity as well (FIG. 18).

Thus, according to the embodiment, the occurrence of the voids inside the semiconductor layer 13 filled into the air gap 90 is suppressed; and the electrical contact defects between the semiconductor body 20 and the semiconductor layer 13 (the source layer) due to the void migration in subsequent annealing can be prevented.

As shown in FIG. 16, the semiconductor portion 82 is provided in a columnar configuration between the semiconductor layer 12 and the semiconductor layer 14 in the state in which the air gap 90 is formed between the semiconductor layer 12 and the semiconductor layer 14. In other words, the semiconductor portions 82 function together with the columnar portions CL as posts maintaining the air gap 90 between the semiconductor layer 12 and the semiconductor layer 14. The flexural strength of the stacked body including the air gap 90 is increased by increasing the number of posts in addition to the columnar portions CL.

The semiconductor layer 13 that is filled into the air gap 90 contacts the sidewall portion 20a of the semiconductor body 20 as shown in FIG. 18. When the columnar portions CL are formed, the semiconductor bodies 20 substantially do not include a dopant. The semiconductor layer 13 is epitaxially grown in high-temperature annealing; and the dopant (e.g., phosphorus) that is included in the semiconductor layer 12 diffuses at this time also into the semiconductor layer 13 and into the contact portion between the semiconductor layer 13 and the sidewall portion 20a of the semiconductor body 20. Accordingly, the contact portion (the source contact portion) between the semiconductor layer 13 and the sidewall portion 20a of the semiconductor body 20 becomes phosphorus-doped silicon; and the resistance is reduced.

It is desirable for the phosphorus to diffuse from the sidewall portion 20a into at least the portion of the semiconductor body 20 opposing the insulating layer 44.

The phosphorus that is inside the semiconductor layer 12 also may diffuse into the semiconductor layer 14 via the semiconductor layer 13. Accordingly, the resistances of the semiconductor layer 13 and the semiconductor layer 14 that are included in a portion of the source layer SL are reduced.

When removing the portion of the memory film 30 exposed in the air gap 90 (FIG. 16), there are also cases where the dopant diffusion prevention film 81 is consumed according to the film type and/or film thickness of the dopant diffusion prevention film 81. As shown in FIG. 18, even in the case where the dopant diffusion prevention film 81 remains inside the semiconductor layer 12, the dopant diffusion prevention film 81 is separated from the lower portion 30a of the memory film 30. Therefore, in the central area where the semiconductor portion 82 is disposed, the route for the phosphorus inside the semiconductor layer 12 to diffuse into the semiconductor layer 13 is ensured between the dopant diffusion prevention film 81 and the lower portion 30a of the memory film 30.

The phosphorus that is inside the semiconductor layer 12 diffuses also into the semiconductor portion 82 via the semiconductor layer 13. The dopant concentration (the phosphorus concentration) of the portion of the semiconductor portion 82 where the diffusion distance of the phosphorus from the semiconductor layer 12 is long may be lower than the dopant concentration (the phosphorus concentration) of the semiconductor layer 12.

After filling the semiconductor layer 13 into the air gap 90, the liner film 61 that is on the side surfaces of the slits ST is removed. The sacrificial layers 71 are removed after removing the liner film 61 or in the same process as the process of removing the liner film 61 by using an etchant or an etching gas supplied through the slits ST. For example, the sacrificial layers 71 which are silicon nitride layers are removed using an etchant including phosphoric acid.

Figure 19:
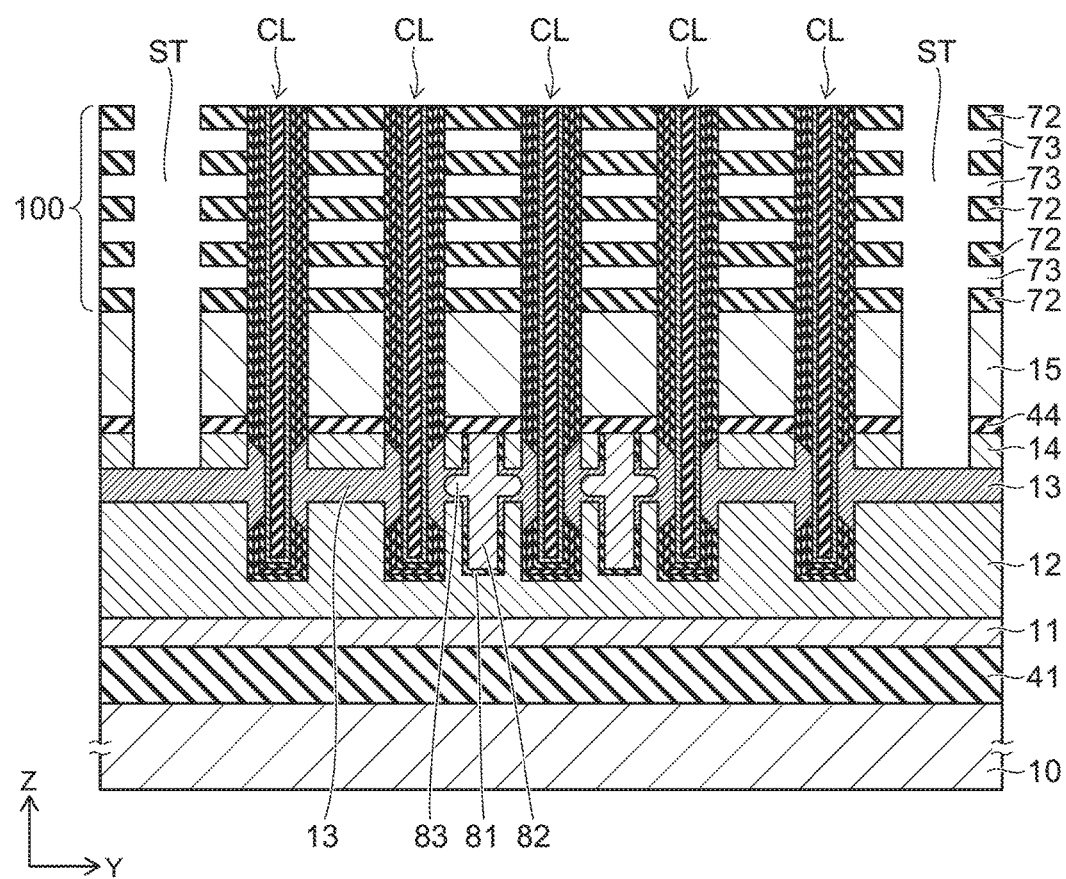

The sacrificial layers 71 are removed; and a gap (an air gap) 73 is formed between the insulating layers 72 adjacent to each other above and below as shown in FIG. 19.

The multiple insulating layers 72 contact the side surfaces of the multiple columnar portions CL to surround the side surfaces of the columnar portions CL. The multiple insulating layers 72 are supported by such a physical bond with the multiple columnar portions CL; and the air gap 73 is maintained between the insulating layers 72.

Figure 20:
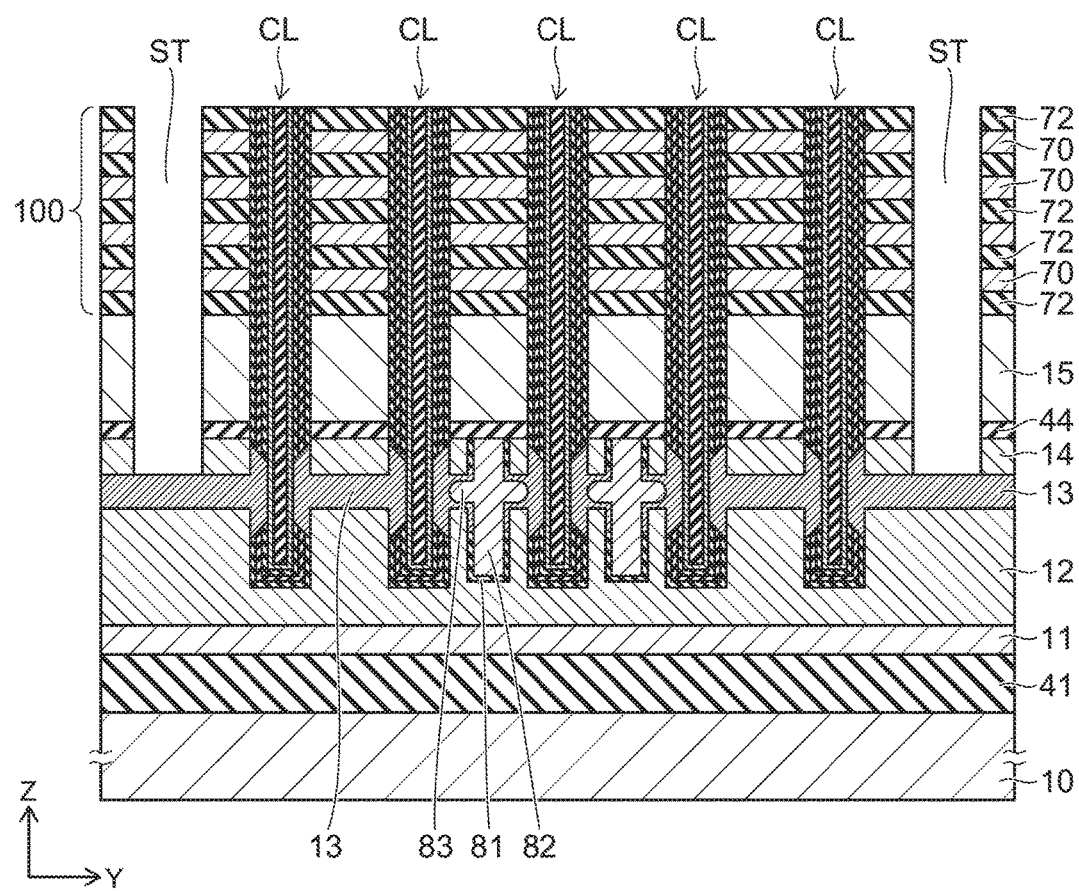

As shown in FIG. 20, the electrode layer 70 is formed in the gap 73. For example, the electrode layer 70 is formed by CVD (chemical vapor deposition). A source gas is supplied to the air gap 73 through the slits ST. The electrode layer 70 that is formed on the side surfaces of the slits ST is removed. Subsequently, the insulating film 63 shown in FIG. 3 is filled into the slits ST.

By pre-growing the protrusion 83 on the side surface of the semiconductor portion 82 in the process shown in FIG. 15, the surface area of the undoped silicon exposed inside the gap 90 can be increased; and the silicon growth in the central area between the slits ST can be promoted further.

Figure 21:
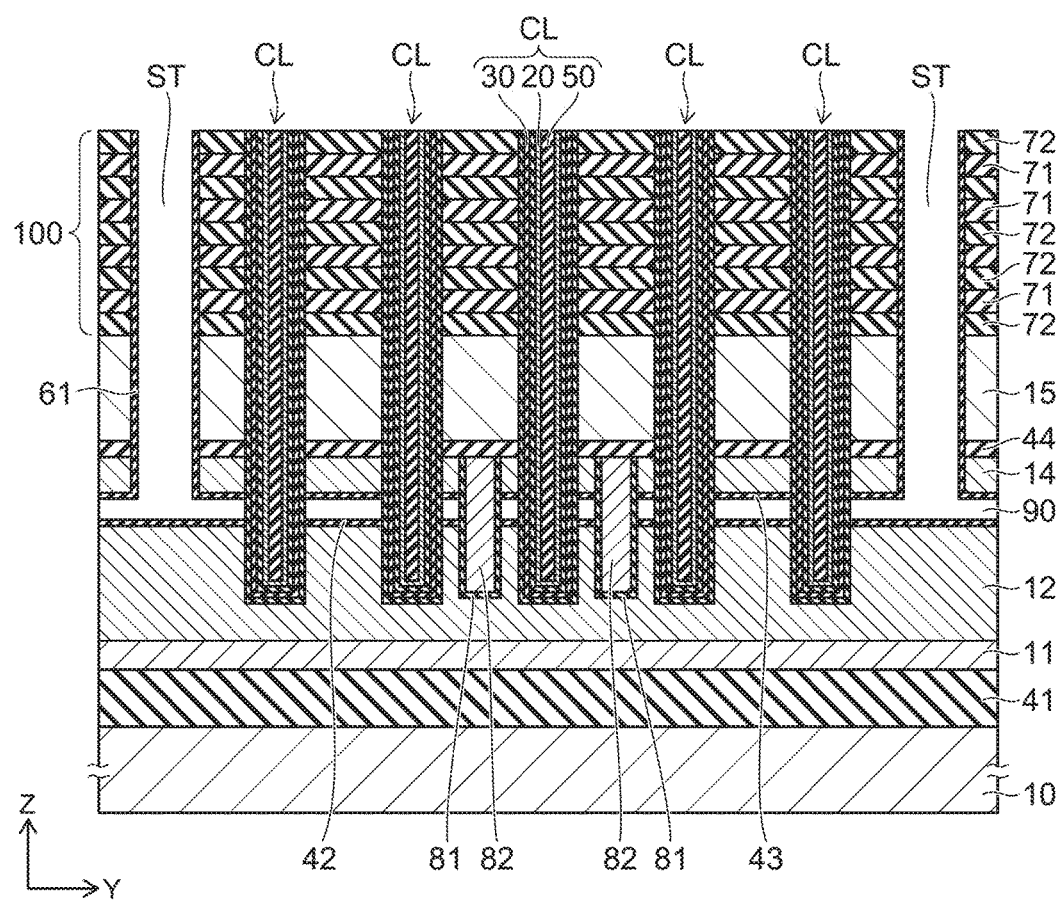
Figure 22:
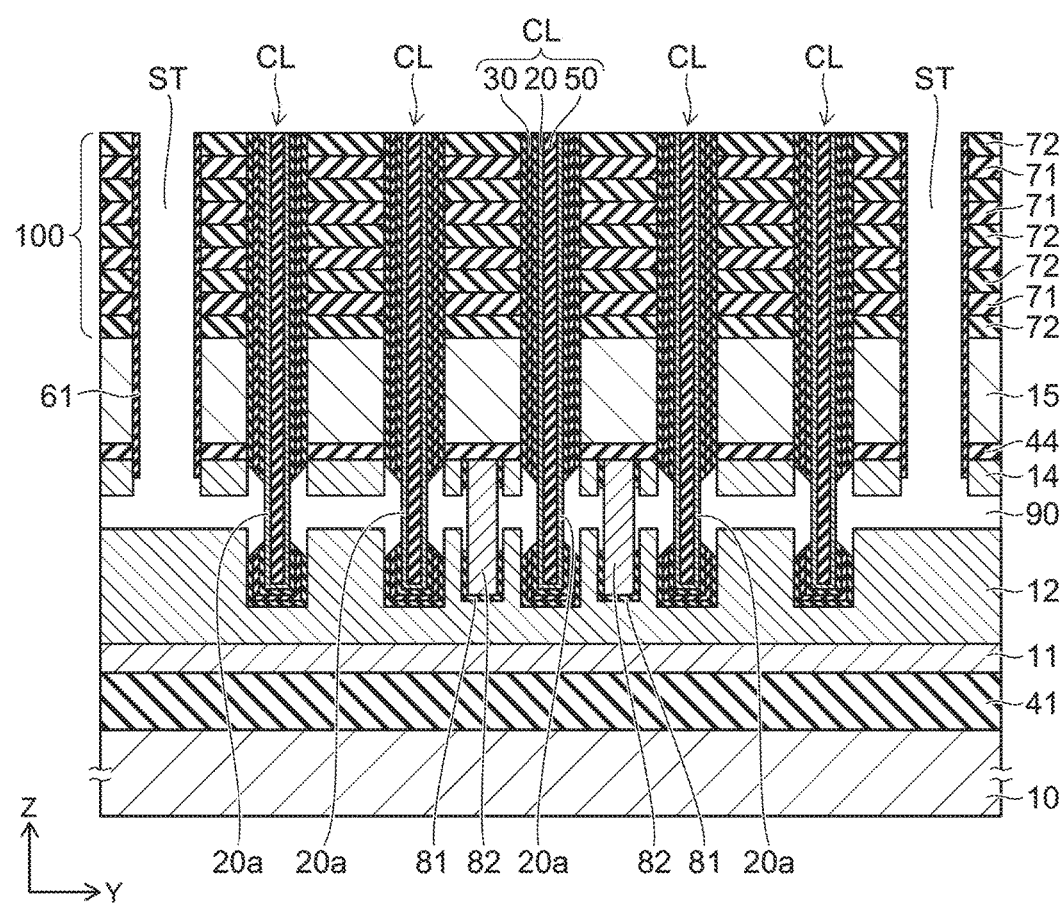
Figure 23:
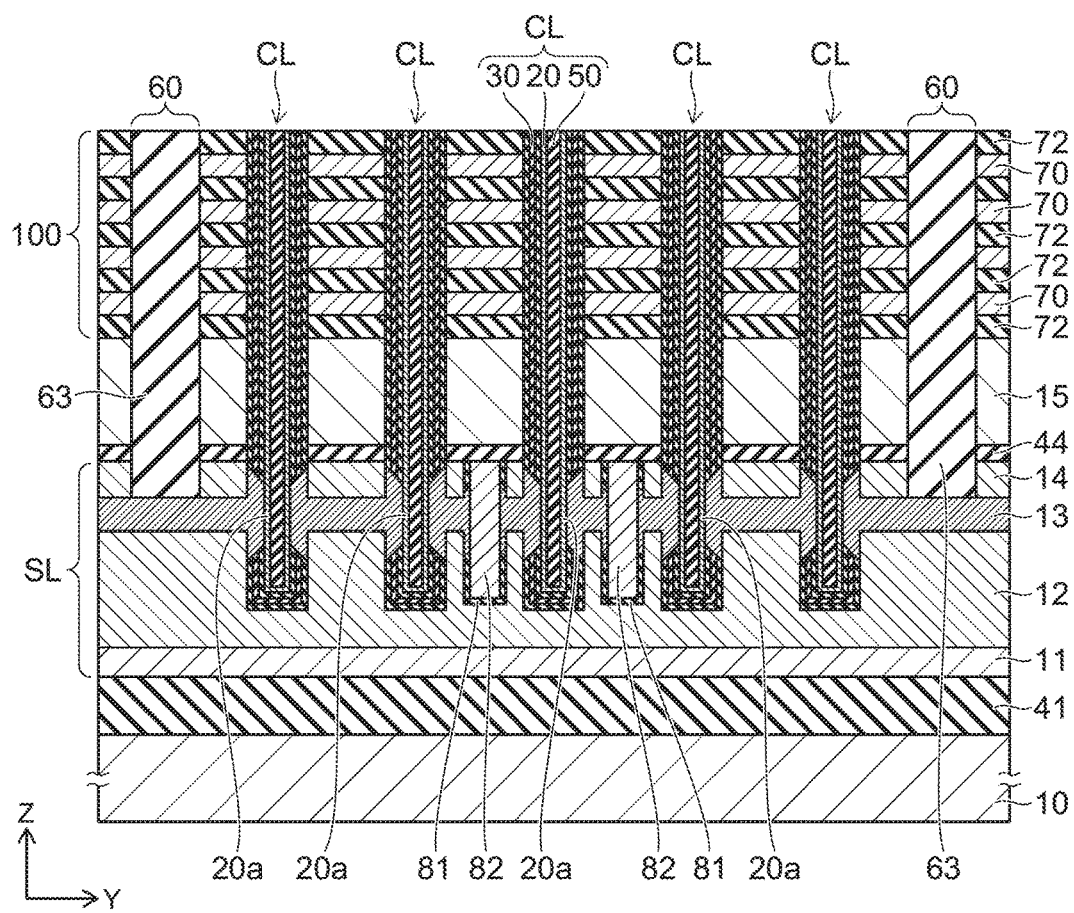

Or, after forming the air gap 90 as shown in FIG. 21, a portion of the memory film 30, the protective films 42 and 43, and a portion of the dopant diffusion prevention film 81 may be removed collectively (FIG. 22); and subsequently, the semiconductor layer 13 may be filled into the air gap 90 without pre-forming the protrusion 83 (FIG. 23). Even in such a case, the silicon starts to grow from the side surface of the undoped semiconductor portion 82 exposed in the air gap 90 before the phosphorus-doped semiconductor layer 12.

Figure 24A:
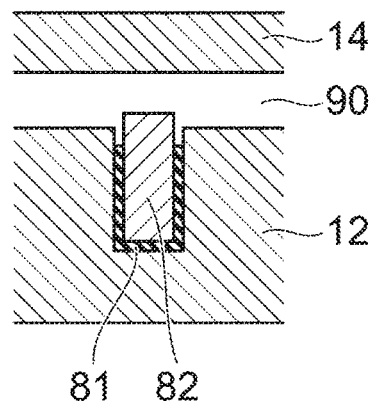
Figure 24B:
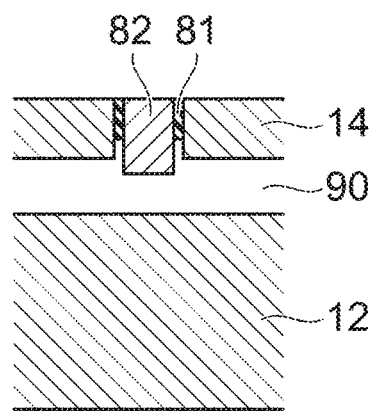

FIGS. 24A and 24B are schematic cross-sectional views showing other structures (formation methods) of the semiconductor portion 82.

By forming the holes 80 shown in FIG. 5B only in the stacked portion of the sacrificial layer 91, the protective film 42, and the semiconductor layer 12, a structure can be formed in which the upper surface of the semiconductor portion 82 protrudes into the air gap 90 as shown in FIG. 24A, through the process for example shown in FIG. 22. Then, the silicon starts to grow from the exposed surface of the semiconductor portion 82 exposed in the air gap 90 before the semiconductor layer 12.

By setting the bottom position of the hole 80 to be partway through the sacrificial layer 91, a structure can be formed in which the lower surface of the semiconductor portion 82 protrudes into the air gap 90 as shown in FIG. 24B, through the process for example shown in FIG. 22. Then, the silicon starts to grow from the exposed surface of the semiconductor portion 82 exposed in the air gap 90 before the semiconductor layer 12. At least, the surface area of the undoped silicon including the semiconductor portion 82 and located in the area (between the slits ST) furthest from the slit ST, effectively increases. This suppresses the formation of voids due to the delay of growth of the silicon in the central are.

FIG. 25 is a schematic plan view of the memory cell array 1 of another embodiment.

Figure 25A:
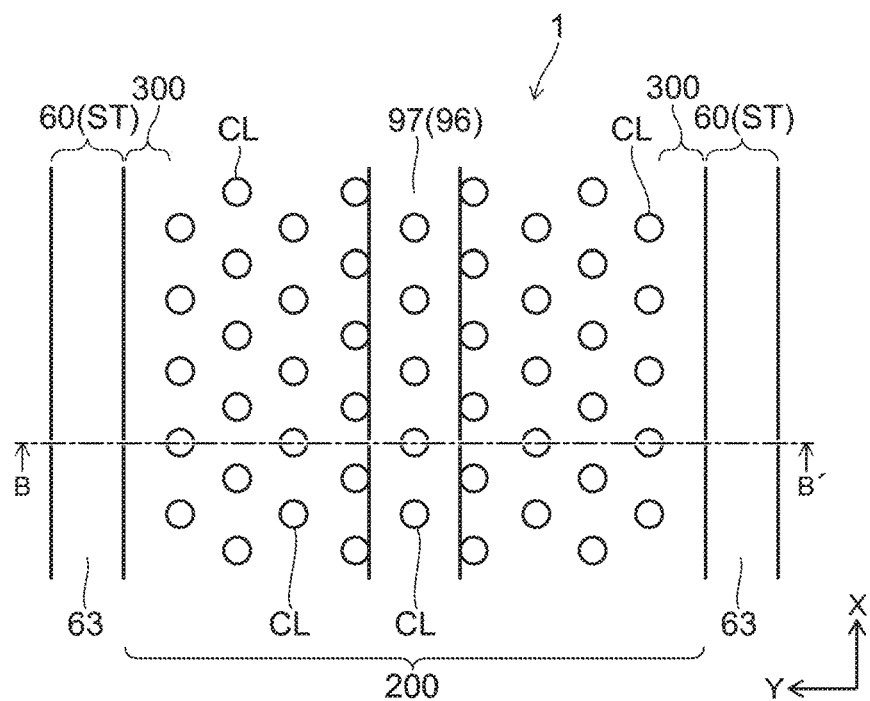
FIGS. 25A and 25B are schematic plan views of the semiconductor device of the embodiment.
Figure 25B:
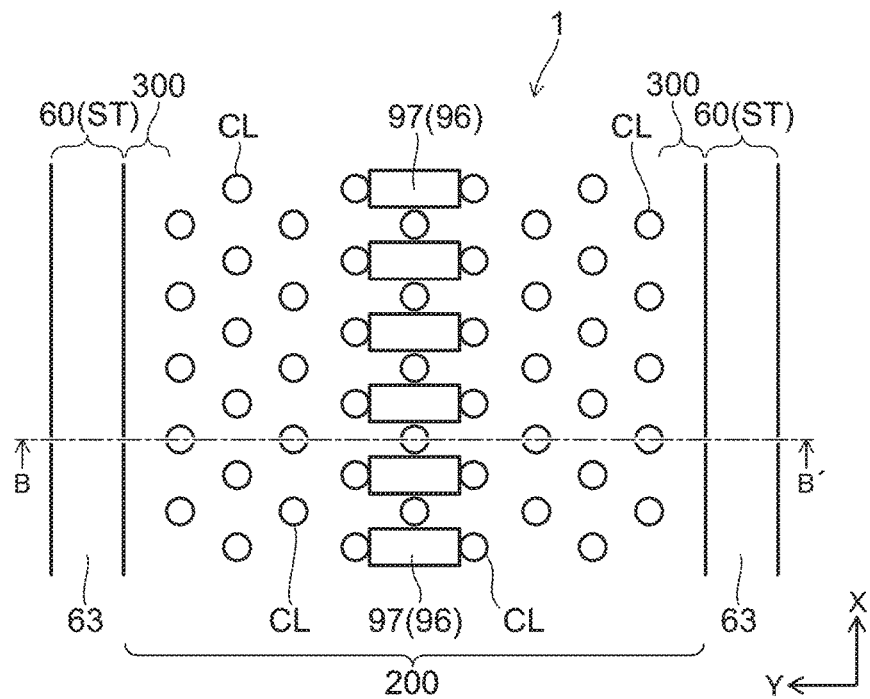
Figure 26:
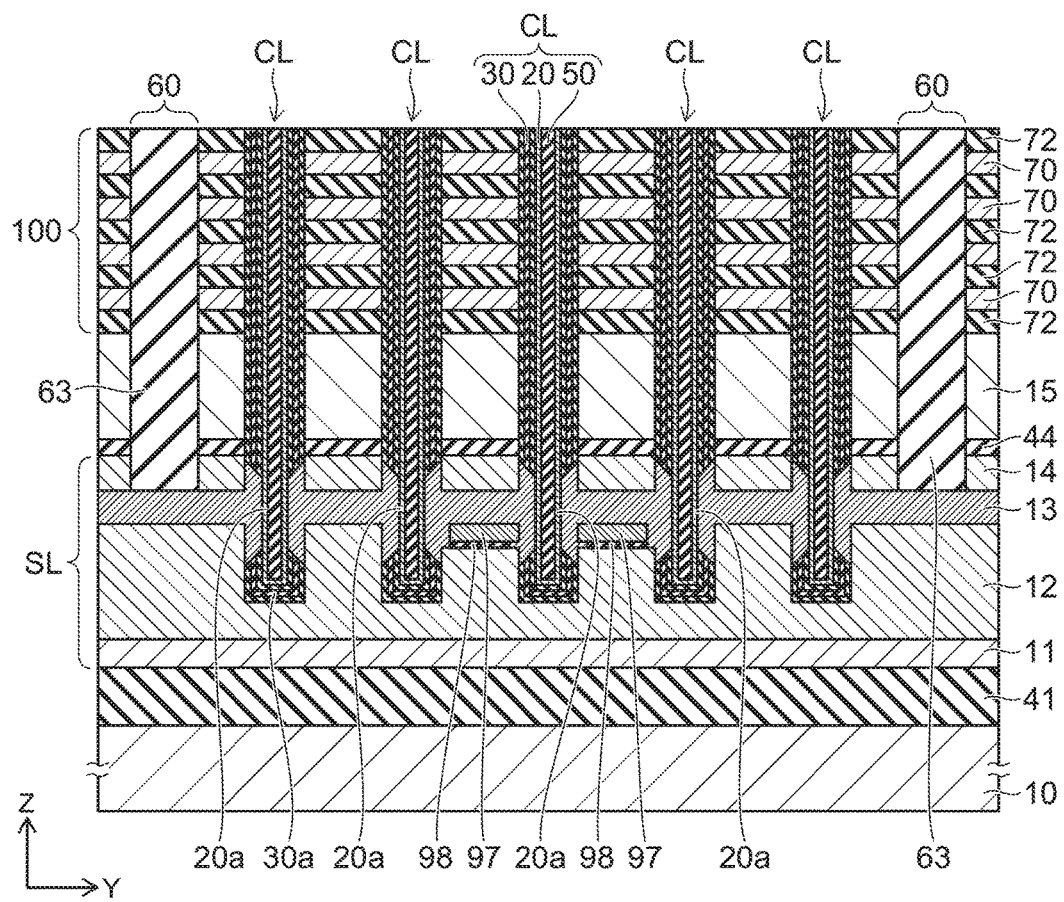
FIG. 26 is a B-B' cross-sectional view of FIG. 25.

FIG. 26 is a B-B' cross-sectional view of FIG. 25. A semiconductor portion 97 is disposed in the area between two separation portions 60 in the Y-direction central area most distal to the separation portions 60. The semiconductor portion 97 is polycrystalline silicon spreading in a planar direction (a direction parallel to the XY plane) orthogonal to the stacking direction (the Z-direction).

As shown in FIG. 26, the semiconductor portion 97 is provided on the semiconductor layer 12; and a dopant diffusion prevention film 98 is provided between the semiconductor layer 12 and the semiconductor portion 97. The dopant diffusion prevention film 98 is a silicon nitride film, an aluminum oxide film, or a silicon oxide film. The dopant diffusion prevention film 98 also spreads in the planar direction (the direction parallel to the XY plane) orthogonal to the stacking direction (the Z-direction) in the central area between the slits ST (the separation portions 60).

The film thickness or material of the dopant diffusion prevention film 98 may be selected so as to have a diffusion prevention effect and to reduce the effect of variation of the etching in RIE for forming the columnar portions CL.

Or the area including the semiconductor portion 97 and the dopant diffusion prevention film 98 may be formed in the pattern, for example, shown in FIG. 25B. This pattern makes it possible to eliminate the variation difference of the etching between the columnar portions CL in RIE. The growth of silicon in the central area can be promoted as in FIG. 25A.

The above semiconductor portion 97 is not limited to being in contact with the neighboring columnar portions CL. If a gap is formed between the semiconductor portion 97 and the columnar portion CL, the growth of silicon in the central area can be promoted.

As shown in FIG. 26, the semiconductor portion 97 and the dopant diffusion prevention film 98 are separated from the columnar portion CL and are positioned at the side of the portion of the columnar portion CL where the memory film 30 is divided (the source contact portion 20*a* of the semiconductor body 20).

The semiconductor portion 97 is polycrystalline silicon formed as one body with the semiconductor layer 13. At least the upper surface of the semiconductor portion 97 contacts the semiconductor layer 13 as one body.

In the example shown in FIG. 25, nine of the columns including the multiple columnar portions CL arranged in the X-direction are arranged along the Y-direction; and among the nine columns, the semiconductor portion 97 and the dopant diffusion prevention film 98 are not disposed at the vicinity of the columns most proximal to the separation portion 60. The semiconductor portion 97 and the dopant diffusion prevention film 98 are not disposed in the area 300 between the separation portion 60 and the columnar portions CL.

A method for manufacturing the semiconductor device shown in FIG. 26 will now be described with reference to FIG. 27A to FIG. 34. The cross sections shown in FIG. 27A to FIG. 34 correspond to the cross section shown in FIG. 26.

Similarly to the embodiment described above, as shown in FIG. 27A, the insulating layer 41 is formed on the substrate 10; the layer 11 that includes the metal is formed on the insulating layer 41; and the semiconductor layer (the first semiconductor layer) 12 is formed on the layer 11 including the metal. The semiconductor layer 12 is, for example, a polycrystalline silicon layer doped with phosphorus.

A recess 96 is formed in the semiconductor layer 12. The recess 96 is formed by RIE using a not-illustrated mask. The recess 96 is formed in the central area between the portions where the slits ST are formed subsequently as shown in FIG. 25.

Figure 27A:
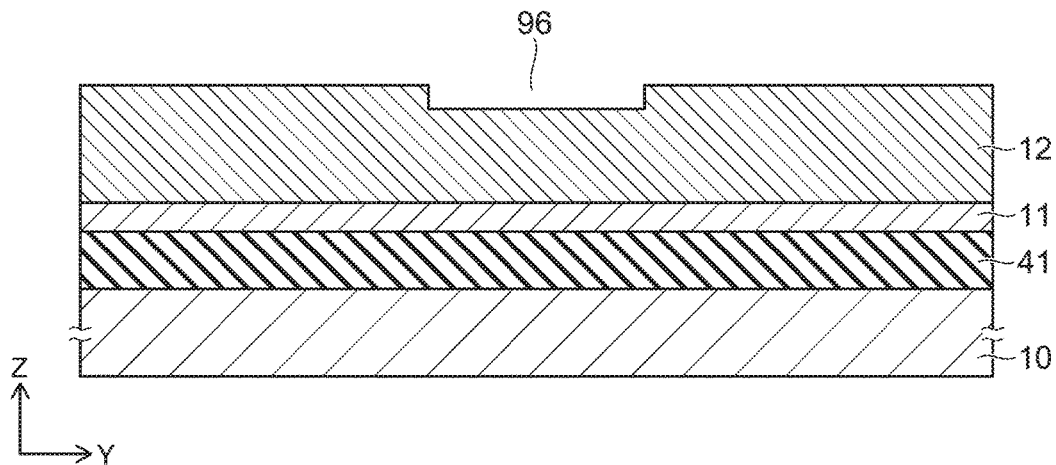
FIG. 27A to FIG. 35B are schematic cross-sectional views showing a method for manufacturing the semiconductor device of the embodiment.
Figure 27B:
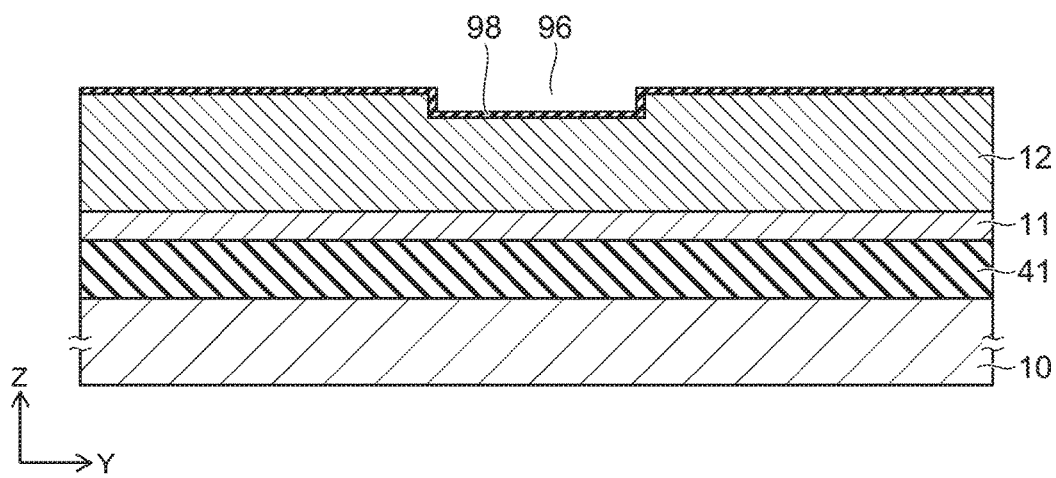

As shown in FIG. 27B, the dopant diffusion prevention film 98 is formed on the bottom surface and the sidewall of the recess 96. The dopant diffusion prevention film 98 is formed conformally along the bottom surface and the sidewall of the recess 96.

The dopant diffusion prevention film 98 has a blocking ability against the diffusion of the dopant (e.g., phosphorus) inside the silicon and is, for example, a silicon nitride film. Or, the dopant diffusion prevention film 98 may be an aluminum oxide film or a silicon oxide film.

Figure 28A:
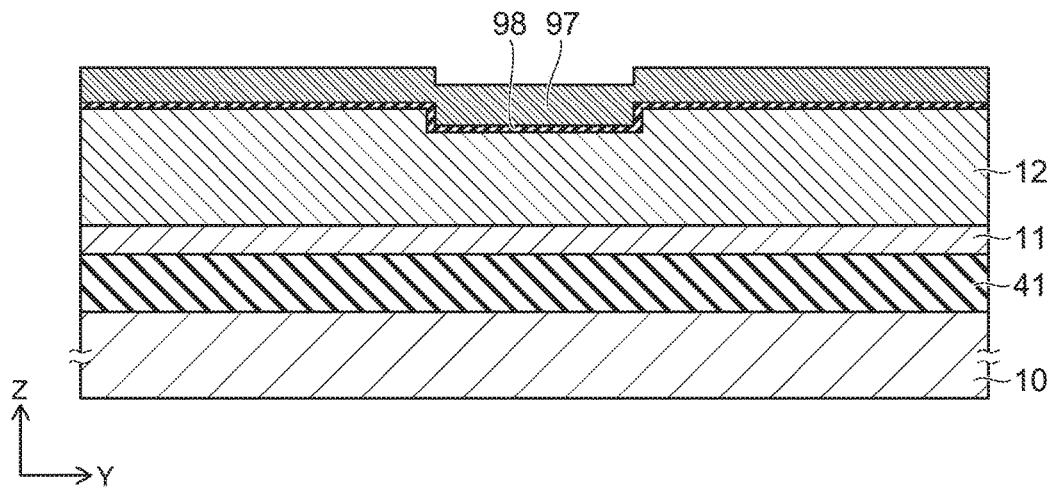

After forming the dopant diffusion prevention film 98, the semiconductor portion 97 is formed inside the recess 96 as shown in FIG. 28A. The dopant concentration of the semiconductor portion 97 is lower than the dopant concentration of the semiconductor layer 12 doped with phosphorus; and the material of the semiconductor portion 97 is undoped polycrystalline silicon. The dopant diffusion prevention film 98 is provided between the semiconductor portion 97 and the semiconductor layer 12.

Figure 28B:
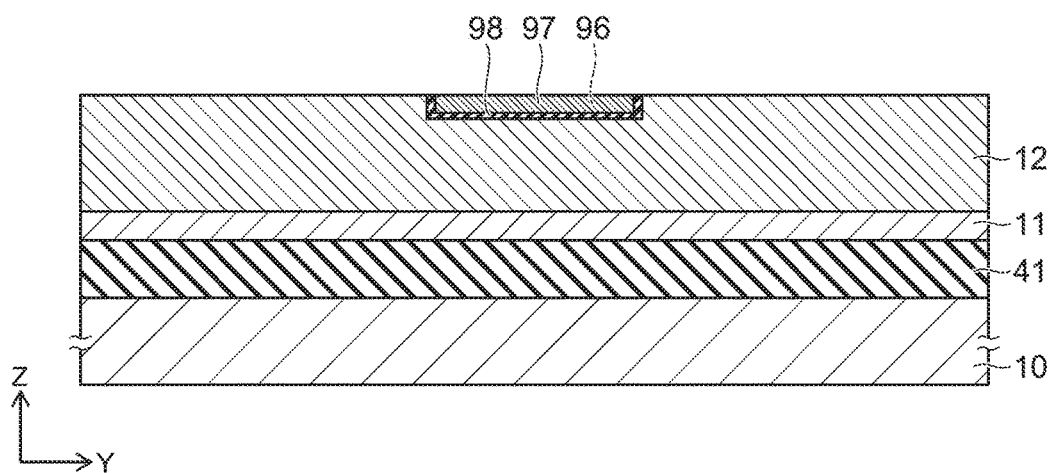

The material films of the dopant diffusion prevention film 98 and the semiconductor portion 97 deposited on the upper surface of the semiconductor layer 12 are removed by, for example, CMP. As shown in FIG. 28B, the upper surface of the semiconductor layer 12, the upper surface of the semiconductor portion 97, and the upper surface of the dopant diffusion prevention film 98 are planarized.

Figure 29:
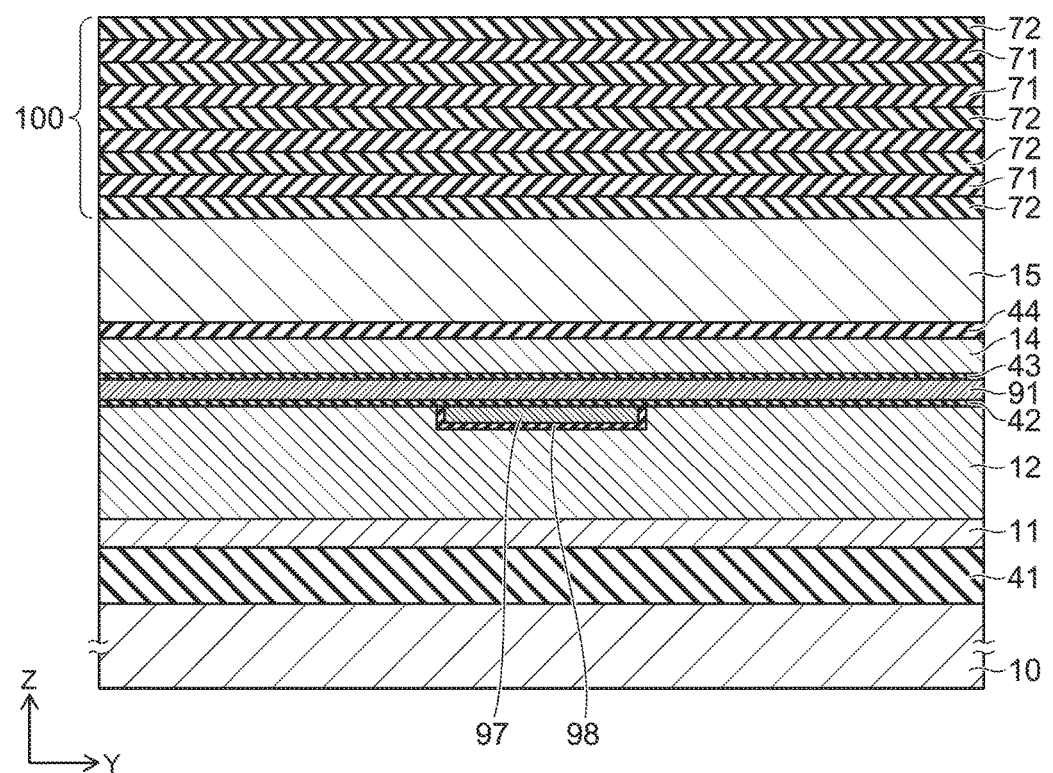

The protective film 42 is formed on the planarized surface as shown in FIG. 29. The sacrificial layer 91 is formed on the protective film 42. The protective film 43 is formed on the sacrificial layer 91. The semiconductor layer (the second semiconductor layer) 14 is formed on the protective film 43.

The insulating layer 44 is formed on such a foundation structure in which the sacrificial layer 91 and the semiconductor portion 97 are formed inside the semiconductor layers. The gate layer 15 is formed on the insulating layer 44. Then, the stacked body 100 that includes the multiple insulating layers (the second layers) 72 and the multiple sacrificial layers (the first layers) 71 is formed on the gate layer 15.

Figure 30:
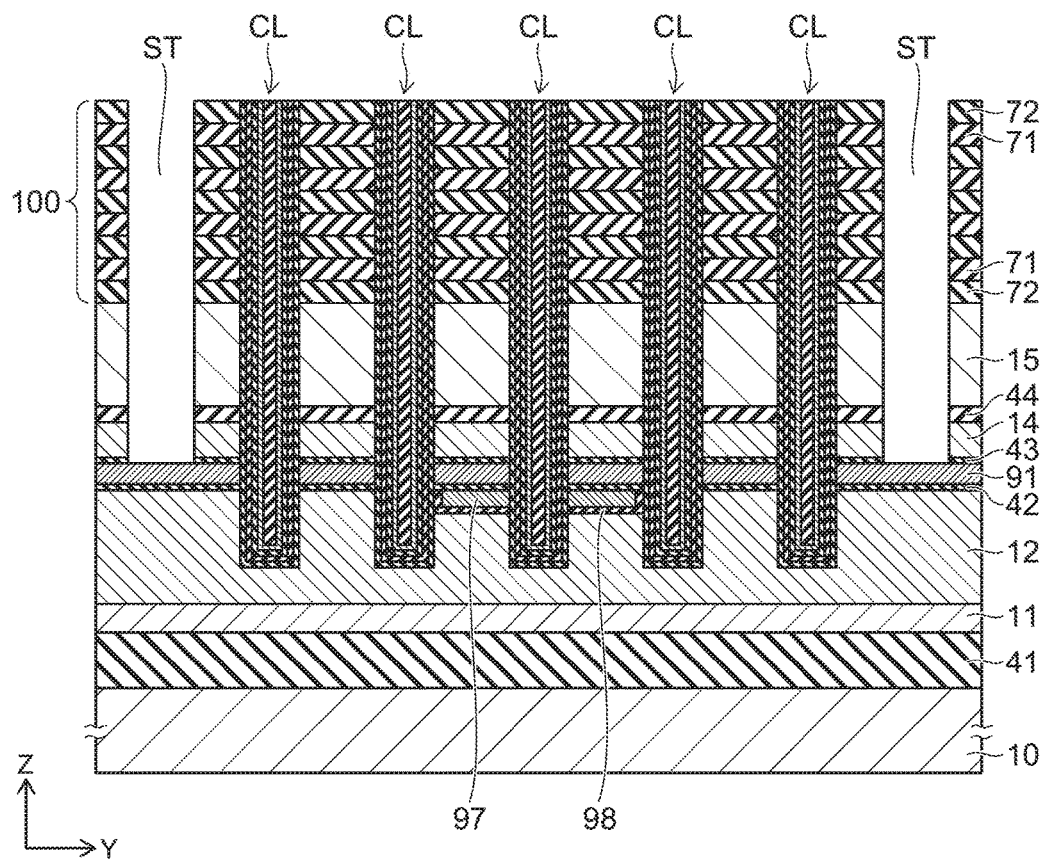

Thereafter, the formation of the memory holes MH and the columnar portions CL is continued similarly to the embodiment described above; and the slits ST are formed as shown in FIG. 30.

The multiple slits ST are formed by RIE using a not-illustrated mask. The slits ST pierce the stacked body 100, the gate layer 15, the insulating layer 44, the semiconductor layer 14, and the protective film 43 and reach the sacrificial layer 91. The sacrificial layer 91 is exposed at the bottoms of the slits ST.

Subsequently, the liner film 61 is formed on the side surfaces of the slits ST; and processes similar to those of the embodiment described above are continued. Namely, the sacrificial layer 91 is removed by etching through the slits ST.

Figure 31:
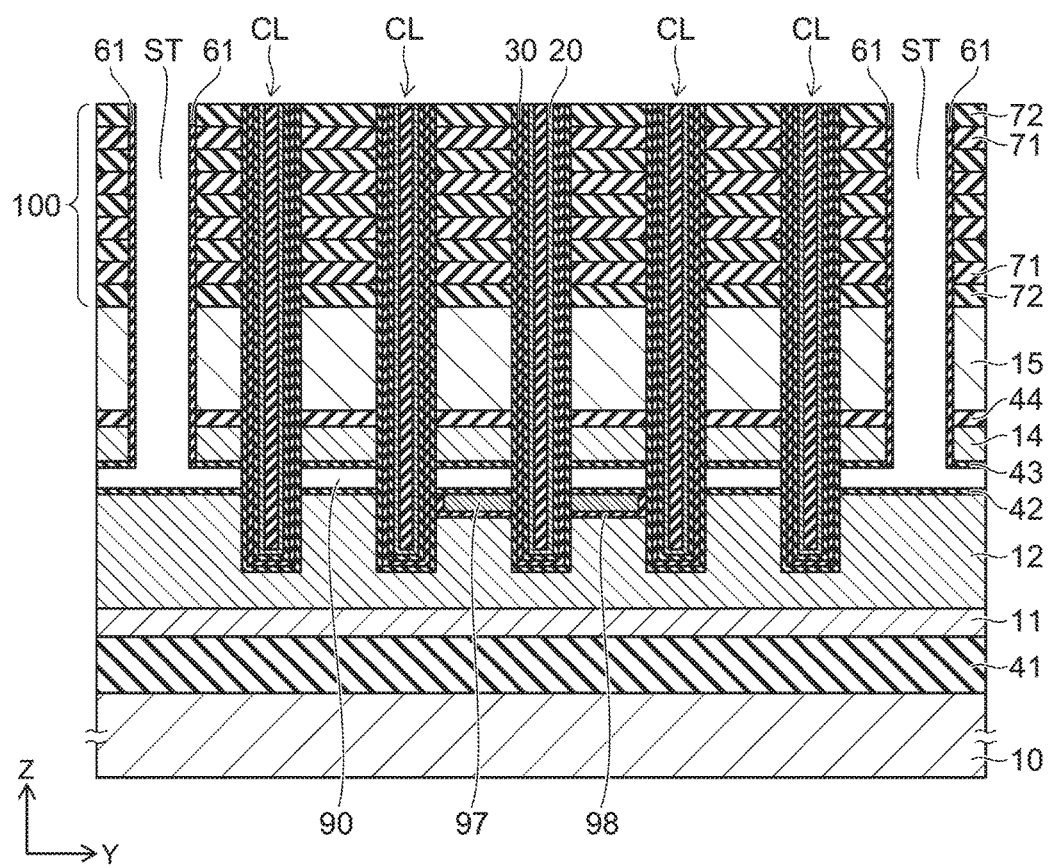

The sacrificial layer 91 is removed; and the air gap 90 is formed between the semiconductor layer 12 and the semiconductor layer 14 as shown in FIG. 31. Portions of the sidewalls of the columnar portions CL (portions of the memory films 30) are exposed in the air gap 90.

The memory films 30 of the columnar portions CL exposed in the air gap 90 are removed by etching (e.g., CDE) through the slits ST. At this time, the protective films 42 and 43 which are the same type of film as the films included in the memory film 30 also are removed. Although the liner film 61 that is formed on the side surfaces of the slits ST is the same type of silicon nitride film as, for example, the charge storage film 32 included in the memory film 30, the film thickness of the liner film 61 is thicker than the film thickness of the charge storage film 32; and the liner film 61 remains on the side surfaces of the slits ST.

Figure 32:
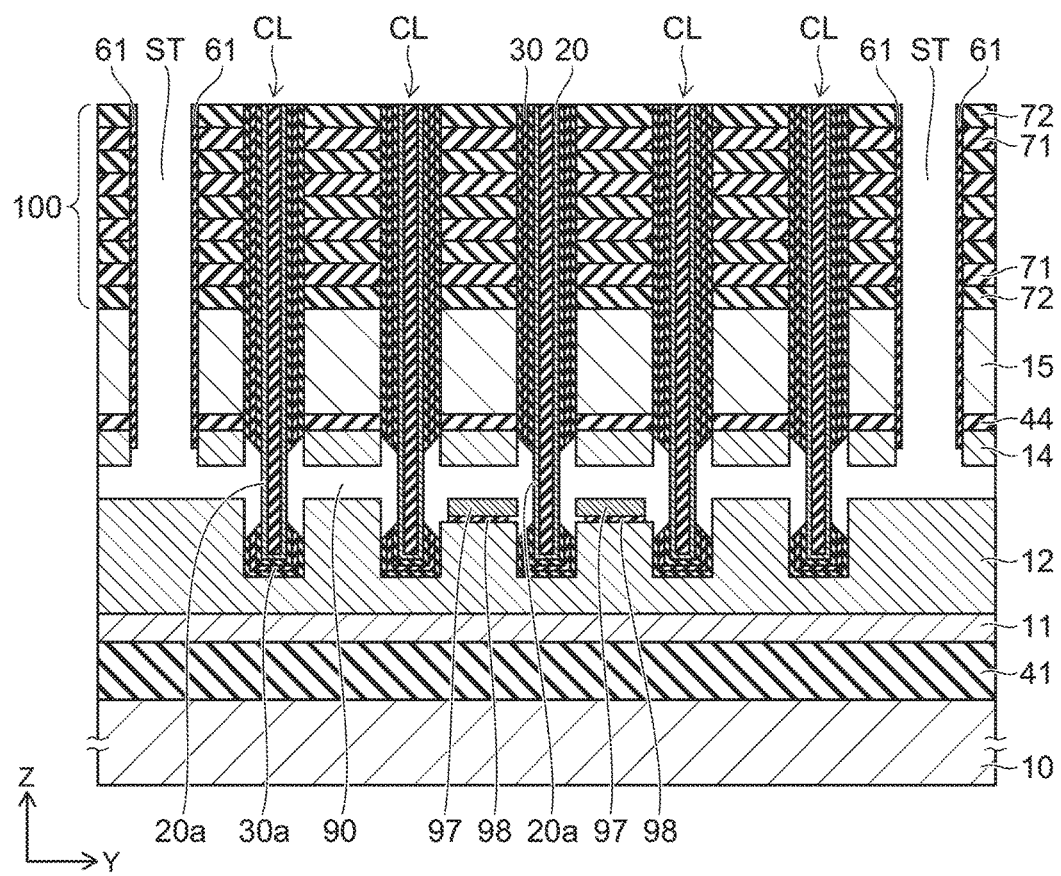

A portion of the memory film 30 is removed from the air gap 90; and the memory film 30 is divided in the stacking direction (the Z-direction) as shown in FIG. 32. By controlling the etching time, the lower portion 30a of the memory film 30 lower than the air gap 90 is caused to remain inside the semiconductor layer 12. The lower end portion of the columnar portion CL remains inside the semiconductor layer 12 as an anchor. The semiconductor layer 12 surrounds the lower end portions of the columnar portions CL and maintains a stable support state of the columnar portions CL in the state in which the air gap 90 is formed.

The portion of the memory film 30 recited above is removed; and a portion (the sidewall portion 20a) of the semiconductor body 20 is exposed in the air gap 90. Also, by removing the protective films 42 and 43, the lower surface of the semiconductor layer 14 and the upper surface of the semiconductor layer 12 are exposed in the air gap 90. At least the upper surface of the semiconductor portion 97 also is exposed in the air gap 90.

The dopant diffusion prevention film 98 that is formed on the side surface of the semiconductor portion 97 (the sidewall of the recess 96 shown in FIG. 28B) also is removed. The dopant diffusion prevention film 98 may remain also on the side surface of the semiconductor portion 97 according to the film type and/or film thickness of the dopant diffusion prevention film 98.

The sidewall portion 20a of the semiconductor body 20, the semiconductor portion 97, the lower surface of the semiconductor layer 14, and the upper surface of the semiconductor layer 12 are exposed in the gap 90. Among these components, the semiconductor layer 12 is phosphorus-doped polycrystalline silicon; and the sidewall portion 20a of the semiconductor body 20, the semiconductor portion 97, and the semiconductor layer 14 have dopant concentrations lower than that of the semiconductor layer 12, and are substantially undoped polycrystalline silicon.

In other words, the phosphorus-doped first semiconductor portion (the semiconductor layer 12) and the undoped second semiconductor portion (the sidewall portion 20a of the semiconductor body 20, the semiconductor portion 97, and the semiconductor layer 14) exist in the polycrystalline silicon exposed in the air gap 90.

There are cases where high-temperature annealing is used when forming the films included in the columnar portion CL. The diffusion of the dopant (the phosphorus) from the semiconductor layer 12 into the semiconductor portion 97 can be prevented because the dopant diffusion prevention film 98 is formed between the semiconductor layer 12 and the semiconductor portion 97 at this time.

Figure 33:
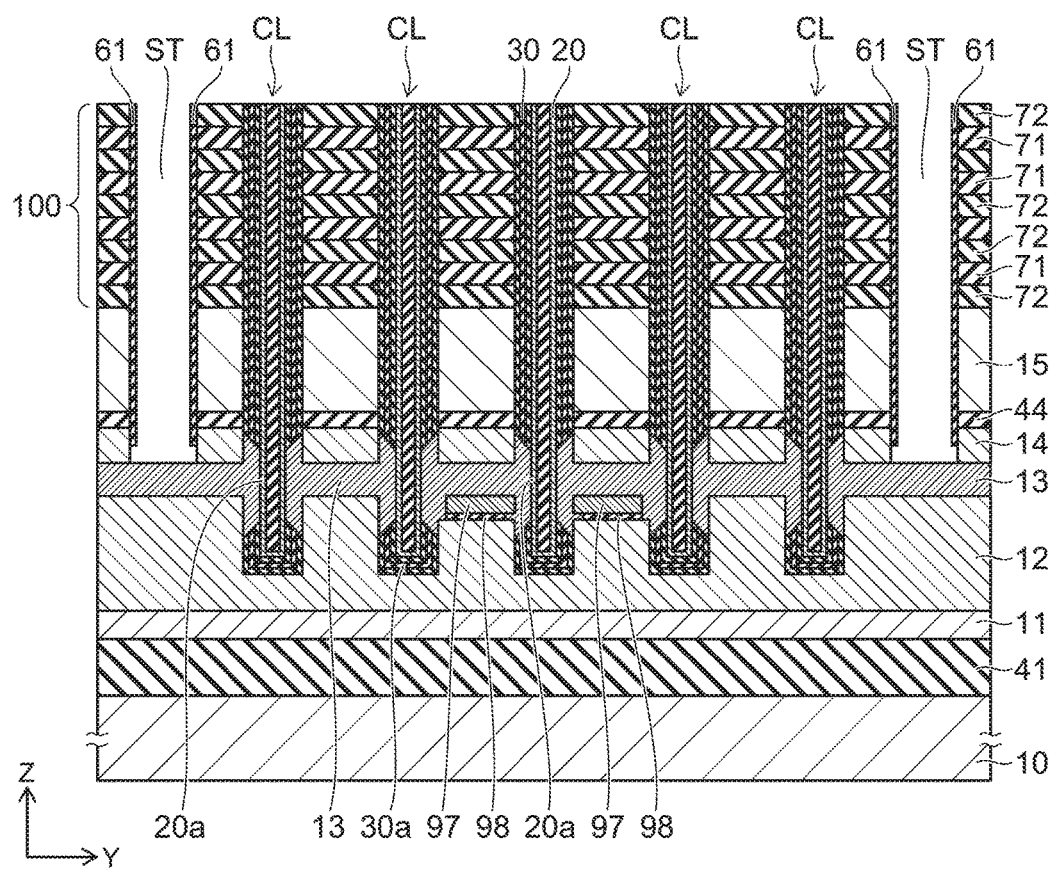

The silicon material is epitaxially grown from the first semiconductor portion and the second semiconductor portion exposed in the air gap 90 by supplying a source gas (a film formation gas) of silicon to the air gap 90 through the slits ST. As shown in FIG. 33, the semiconductor layer (the third semiconductor layer) 13 is filled into the air gap 90.

In the embodiment as well, the silicon portions that are exposed in the air gap 90 have a dopant concentration difference. Accordingly, for a constant amount of time directly after the film formation start, the incubation time of the silicon grown from the semiconductor portion 97 which is undoped silicon is shorter than the incubation time of the silicon grown from the semiconductor layer 12 which is phosphorus-doped silicon; and the silicon starts to grow earlier from the semiconductor portion 97 than from the upper surface of the semiconductor layer 12.

Because the semiconductor portion 97 is disposed at the periphery of the columnar portions CL disposed in the area most distal to the slits ST (the central area between the slits ST), the growth of the silicon progresses first from the central area between the slits ST.

The growth of the silicon progresses faster in the central area between the slits ST than in the area at the slit ST vicinity; and the voids (the seams) do not remain easily inside the semiconductor layer 13 of the central area. In the embodiment as well, the occurrence of the voids inside the semiconductor layer 13 filled into the air gap 90 can be suppressed; and the electrical contact defects between the semiconductor body 20 and the semiconductor layer 13 (the source layer) due to the void migration in the subsequent annealing can be prevented.

The dopant diffusion prevention film 98 that remains inside the semiconductor layer 12 is separated from the lower portion 30a of the memory film 30. Therefore, the route for the phosphorus inside the semiconductor layer 12 to diffuse into the semiconductor layer 13 is ensured between the dopant diffusion prevention film 98 and the lower portion 30a of the memory film 30.

The phosphorus that is inside the semiconductor layer 12 may diffuse also into the semiconductor portion 97 via the semiconductor layer 13. The dopant concentration (the phosphorus concentration) of the portion of the semiconductor portion 97 where the diffusion distance of the phosphorus from the semiconductor layer 12 is long may be lower than the dopant concentration (the phosphorus concentration) of the semiconductor layer 12.

After filling the semiconductor layer 13 into the air gap 90, the liner film 61 that is on the side surfaces of the slits ST is removed; and processes similar to those of the embodiment described above are continued. Namely, the sacrificial layers 71 are removed by an etchant or an etching gas supplied through the slits ST.

Figure 34:
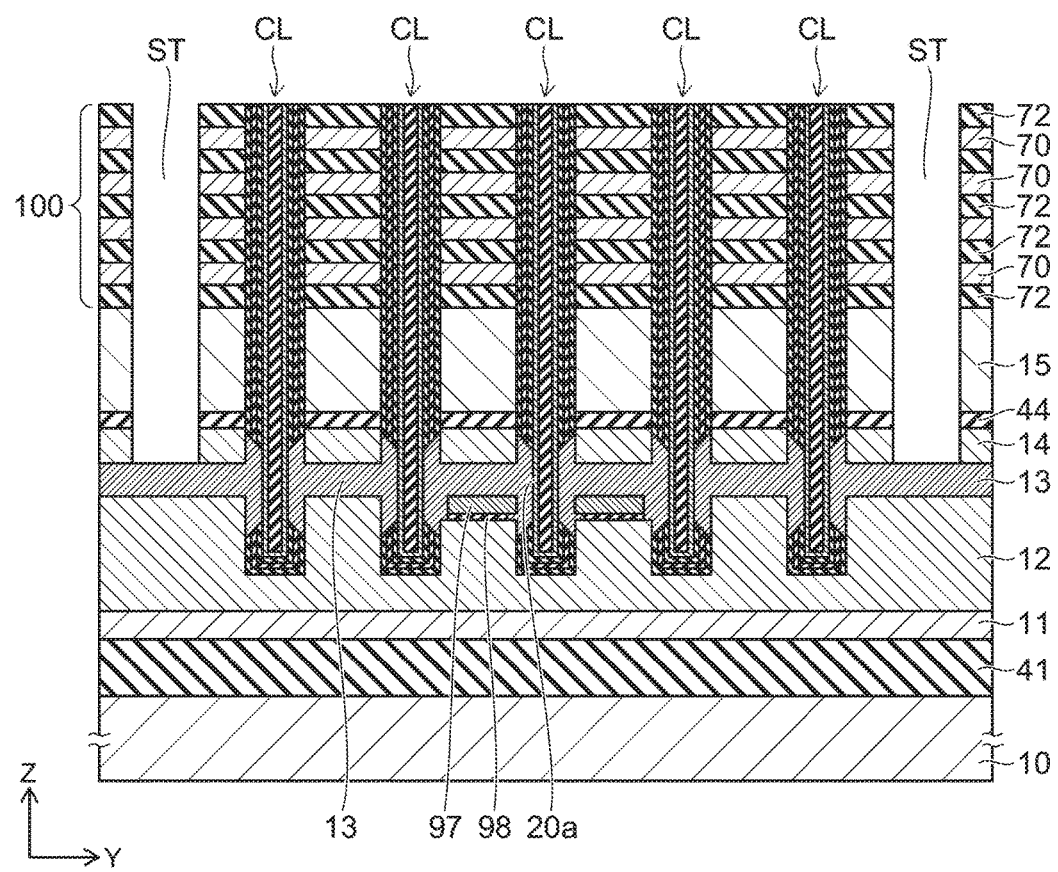

The sacrificial layers 71 are removed; and a gap (an air gap) is formed between the insulating layers 72 adjacent to each other above and below. As shown in FIG. 34, the electrode layer 70 is formed in the air gap. Subsequently, the insulating film 63 shown in FIG. 26 is filled into the slits ST.

Figure 35A:
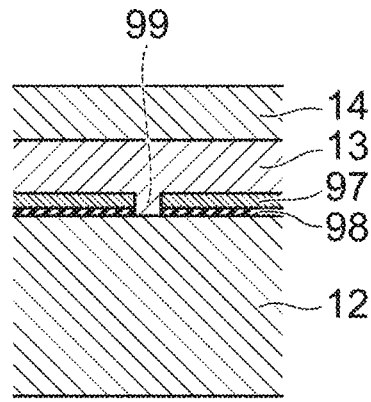
Figure 35B:
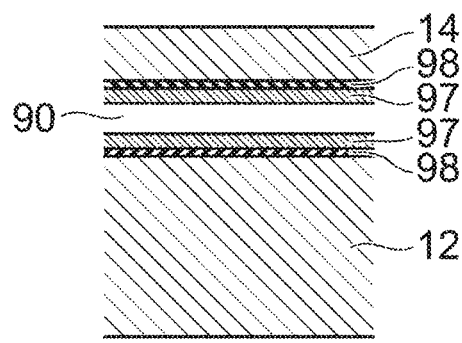

FIGS. 35A and 35B are schematic cross-sectional views showing other structures (formation methods) of the semiconductor portion 97.

In the example shown in FIG. 35A, an opening (a hole or trench) 99 that pierces the dopant diffusion prevention film 98 and the semiconductor portion 97 formed on the upper surface of the semiconductor layer 12 is formed. The opening 99 functions as a diffusion route of the dopant (the phosphorus) from the semiconductor layer 12 into the semiconductor layer 13. The decrease of the dopant concentration in the semiconductor layer 13 and in the sidewall portion (the source contact portion) 20a of the semiconductor body 20 can be suppressed in the area where the dopant diffusion prevention film 98 is disposed.

Although the semiconductor layer 14 that is positioned on the air gap 90 as shown in FIG. 32 is described as an undoped silicon layer in the embodiment described above, the semiconductor layer 14 may be a phosphorous-doped silicon layer.

In such a case, for example, the undoped semiconductor portion 97 may be provided with the dopant diffusion prevention film 98 interposed on the lower surface of the phosphorus-doped semiconductor layer 14 as shown in FIG. 35B in the central area between the slits ST. The undoped semiconductor portions 97 that are on and under the air gap 90 are provided to be exposed in the air gap 90; and the silicon growth can be promoted from the upper wall side of the air gap 90 as well.

Although a silicon nitride layer is illustrated as the first layer 71 in the embodiment recited above, a metal layer or a silicon layer that is doped with a dopant may be used as the first layer 71. In such a case, the first layer 71 is used to form the electrode layer 70 as-is; therefore, the process of replacing the first layer 71 with the electrode layer is unnecessary.

The second layer 72 may be removed by etching through the slits ST; and the region between the electrode layers 70 adjacent to each other above and below may be an air gap.

The first embodiment, for example, shown in FIG. 2 and the second embodiment, for example, shown in FIG. 25A, 25B may be combined. For example, the growth promoting portion of silicon shown in FIG. 24B and the growth promoting portion of silicon shown in FIG. 26 may be combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a source layer including a semiconductor layer including a dopant;
a stacked body provided on the source layer, the stacked body including a plurality of electrode layers stacked with an insulator interposed;
a plurality of separation portions extending through the stacked body in a stacking direction of the stacked body and dividing the stacked body into a plurality of blocks;
a plurality of columnar portions disposed in an area between the separation portions, the columnar portions extending in the stacking direction through the stacked body and through the semiconductor layer, the columnar portions including a plurality of semiconductor bodies including sidewall portions contacting the semiconductor layer; and
a dopant diffusion prevention film provided inside the semiconductor layer and separated from the columnar portions in an area between the columnar portions, the dopant diffusion prevention film not being provided inside the semiconductor layer in an area between the separation portion and the columnar portions.

2. The device according to claim 1, wherein
the semiconductor layer includes:
a first semiconductor layer surrounding lower end portions of the columnar portions;
a second semiconductor layer contacting the sidewall portions of the semiconductor bodies and being provided on the first semiconductor layer; and
a semiconductor portion provided in a columnar configuration inside the first semiconductor layer and inside the second semiconductor layer, and
the dopant diffusion prevention film is provided on a side surface of the semiconductor portion.

3. The device according to claim 2, wherein
the dopant diffusion prevention film is not provided at a portion of the semiconductor portion adjacent to the second semiconductor layer, and
the portion of the semiconductor portion contacts the second semiconductor layer.

4. The device according to claim 2, wherein
the semiconductor layer further includes a third semiconductor layer provided on the second semiconductor layer,
the semiconductor portion extends in a columnar configuration through the first semiconductor layer, through the second semiconductor layer, and through the third semiconductor layer,
the dopant diffusion prevention film provided on the side surface of the semiconductor portion is divided in the stacking direction at a portion adjacent to the second semiconductor layer, and
the semiconductor portion contacts the second semiconductor layer at a portion where the dopant diffusion prevention film is divided.

5. The device according to claim 2, wherein a dopant concentration of the semiconductor portion is lower than a dopant concentration of the first semiconductor layer.

6. The device according to claim 1, wherein the dopant diffusion prevention film surrounds a periphery of the columnar portions and spreads in a planar direction orthogonal to the stacking direction.

7. The device according to claim 6, wherein
the columnar portions includes insulating films provided on side surfaces of the semiconductor bodies,
the insulating films are divided in the stacking direction at a portion where the semiconductor layer and the sidewall portions of the semiconductor bodies contact, and
the dopant diffusion prevention film is positioned at a side of a portion where the insulating films are divided.

8. The device according to claim 6, wherein
the semiconductor layer includes:
a first semiconductor layer surrounding lower end portions of the columnar portions; and
a semiconductor portion provided on the first semiconductor layer with the dopant diffusion prevention film interposed.

9. The device according to claim 8, wherein a dopant concentration of the semiconductor portion is lower than a dopant concentration of the first semiconductor layer.

10. The device according to claim 1, wherein the dopant diffusion prevention film is a silicon nitride film, an aluminum oxide film, or a silicon oxide film.

11. The device according to claim 1, wherein the semiconductor layer is a silicon layer doped with phosphorus.

12. The device according to claim 1, wherein
the source layer further includes a layer including a metal, and
the semiconductor layer is provided between the stacked body and the layer including the metal.

13. The device according to claim 1, wherein the columnar portions further include charge storage portions provided between the semiconductor bodies and one of the electrode layers.

* * * * *